(12) United States Patent
Hutto et al.

(10) Patent No.: US 8,314,498 B2
(45) Date of Patent: Nov. 20, 2012

(54) ISOLATED BOND PAD WITH CONDUCTIVE VIA INTERCONNECT

(75) Inventors: Kevin Hutto, Kuna, ID (US); Ross Dando, Nampa, ID (US); Swarnal Borthakur, Boise, ID (US); Richard Mauritzson, Santa Clara, CA (US)

(73) Assignee: Aptina Imaging Corporation, George Town (KY)

( * ) Notice: Subject to any disclaimer, the term of this patent is extended or adjusted under 35 U.S.C. 154(b) by 130 days.

(21) Appl. No.: 12/879,452

(22) Filed: Sep. 10, 2010

(65) Prior Publication Data

US 2012/0061786 A1 Mar. 15, 2012

(51) Int. Cl.
*H01L 23/48* (2006.01)
(52) U.S. Cl. . 257/774; 257/432; 257/444; 257/E31.124; 257/E31.127; 438/80; 438/667
(58) Field of Classification Search ................. 257/432, 257/437, 444, 774, E31.124, E31.127; 438/70, 438/72, 80, 667
See application file for complete search history.

(56) References Cited

U.S. PATENT DOCUMENTS

| | | | |
|---|---|---|---|
| 7,355,267 B2* | 4/2008 | Kirby et al. | 257/621 |
| 2007/0167004 A1* | 7/2007 | Trezza | 438/667 |
| 2010/0321544 A1* | 12/2010 | Matsuo et al. | 348/294 |
| 2011/0140282 A1* | 6/2011 | Nakano | 257/774 |
| 2011/0227186 A1* | 9/2011 | Chang et al. | 257/448 |
| 2012/0007249 A1* | 1/2012 | Kuo et al. | 257/774 |
| 2012/0013022 A1* | 1/2012 | Sabuncuoglu Tezcan et al. | 257/774 |
| 2012/0061821 A1* | 3/2012 | Black et al. | 257/737 |

* cited by examiner

*Primary Examiner* — Allan R Wilson

(57) ABSTRACT

An integrated circuit for use, for example, in a backside illuminated imager device includes circuitry provided on a first side of a substrate, a first conductive pad connected to the circuitry and spaced from the first side of the substrate, a second conductive pad spaced from a second side of the substrate, an electrically conductive interconnect formed through the substrate to interconnect the first and second conductive pads, and a dielectric surrounding the second conductive pad and at least a portion of the interconnect. Methods of forming the integrated circuit are also described.

15 Claims, 30 Drawing Sheets

ISOLATED BOND PAD WITH CONDUCTIVE VIA INTERCONNECT

FIELD OF THE INVENTION

Embodiments described herein relate generally to the field of solid state imager devices. In particular, the embodiments relate to forming isolated bond pads for integrated circuits and particularly for backside illuminated imager devices.

BACKGROUND OF THE INVENTION

There are a number of different types of semiconductor-based imager devices, including those employing charge coupled devices (CCDs), charge injection devices (CIDs), hybrid focal plane arrays, and complementary metal oxide semiconductor (CMOS) pixel arrays. Current applications of solid-state imager devices include cameras, scanners, machine vision systems, vehicle navigation systems, video telephones, computer input devices, surveillance systems, automatic focus systems, star trackers, motion detector systems, image stabilization systems, and other image acquisition and processing systems.

CMOS imager devices are well known. CMOS imager devices are discussed, for example, in Nixon et al., "256×256 CMOS Active Pixel Sensor Camera-on-a-Chip," IEEE Journal of Solid-State Circuits, Vol. 31 (12), pp. 2046-2050 (1996); Mendis et al., "CMOS Active Pixel Imager devices," IEEE Transactions on Electron Devices, Vol. 41 (3), pp. 452-453 (1994); and are also disclosed in U.S. Pat. Nos. 6,140,630, 6,204,524, 6,310,366 and 6,326,652, assigned to Aptina Imaging Corporation, the entire disclosures of which are incorporated herein by reference.

CMOS imager devices are typically formed with an array of pixels each containing a photosensor, such as a photogate, phototransistor, photoconductor, or photodiode. The photosensor in each pixel absorbs incident radiation of a particular wavelength (e.g., optical photons or x-rays) and produces an electrical signal corresponding to the intensity of light impinging on that pixel when an optical image is focused on the pixel array. For example, the magnitude of the electrical signal produced by each pixel can be proportional to the amount of incident light captured. The electrical signals from all pixels are then processed to provide information about the captured optical image for storage, printing, transmission, display, or other usage.

Imager devices have traditionally been constructed so that light impinges on the frontside of a device, the frontside being the top of a device built on a semiconductor substrate. New advances, however, have produced backside illuminated imager devices, which receive incident radiation through a backside of the device substrate. Example methods of forming backside illuminated imager devices are disclosed in U.S. Pat. No. 6,429,036 and U.S. application Ser. Nos. 12/480,440 and 12/533,709 assigned to Aptina Imaging Corporation, the entire disclosures of which are incorporated herein by reference. Backside illuminated imager devices are advantageous because the backside of an imager device has less processing features (metalization, polysilicon, diffusions, etc.) that would obscure photosensors and result in a loss of photons reaching the sensitive area of the photosensors.

Backside illuminated imager devices presently require that electrical connections be formed to metal patterns that are below the substrate (the substrate being at the top of these devices). It is possible to remove portions of the substrate to provide connections to electrical pads below the substrate (using wire bonds, for example), but this results in additional features on the color filter array (CFA) side of the substrate and an uneven topography of the substrate. The uneven topography presents problems with subsequent processing steps. Accordingly, a method to form electrical connections to bond pads that results in minimal topographic features and minimizes processing steps is desired.

DETAILED DESCRIPTION OF THE INVENTION

In the following detailed description, reference is made to certain embodiments. These embodiments are described with sufficient detail to enable those skilled in the art to practice them. It is to be understood that other embodiments may be employed, and that various structural, logical, and electrical changes may be made without departing from the spirit or scope of the invention.

Embodiments described herein provide methods of creating isolated bond pads for integrated circuits and particularly for backside illuminated imager devices that reduce the number and size of open features on the color filter array (CFA) side of a device, involve minimal processing steps, and result in a more cost effective product.

Figure 1A:
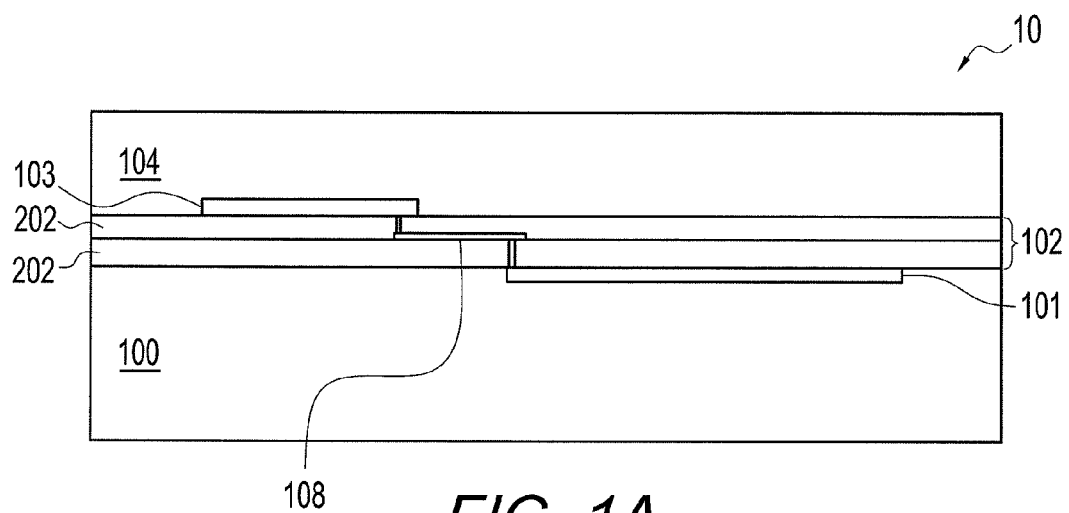
FIGS. 1A-1N illustrate in cross-section and top views the formation of electrical bond pads connected via an electrical interconnect that is surrounded by an electrically isolated region in accordance with an embodiment described herein.

Referring to FIG. 1A, one embodiment is now described with reference to the fabrication of a structure for use in an imager device fabrication, wherein like reference numbers are used consistently for like features throughout the drawings.

FIG. 1A illustrates an example structure 10 for a backside illuminated imager device. As shown in FIG. 1A, the embodiment begins with a structure 10 that has been formed with a substrate 100 such as a semiconductor substrate, e.g., a silicon substrate. Imager circuitry 101 is formed on substrate 100 and includes pixel circuits each containing a photosensor and other pixel circuitry, as well as array readout and signal processing circuits. Dielectric material 102 is formed over the substrate 100 and the imager circuitry 101, and an electrically conductive bond pad 103 is formed over the dielectric material 102. For a back side illuminated imager device, the dielectric material 102 and bond pad 103 are covered by a permanent carrier 104 which causes bond pad 103 to be buried within the substrate 100. The permanent carrier 104 can be attached to the dielectric material 102 by oxide-to-oxide bonding or oxide-polymer bonding or other known methods.

Dielectric material 102 may be formed in multiple layers of interlayer dielectric material 202, such as borophosphosilicate glass (BPSG) or an oxide, which support and insulate multiple layers of conductive material traces that form electrical connections to various components of the imager circuitry 101. For example, FIG. 1A illustrates an example electrical connection 108 formed between the imager circuitry 101 and the electrically conductive bond pad 103. This electrical connection 108 may be used to provide signal paths used to operate the imager device circuitry, for example, for controlling the imager circuitry 101 or reading out charges acquired by the arrayed photosensors which are electrically connected to imager circuitry 101. Many such electrical connections may be formed to various electrical connection points of the structure 10 interspersed between layers of interlayer dielectric material 202 (as described in more detail below in reference to FIG. 1I).

Figure 1B:
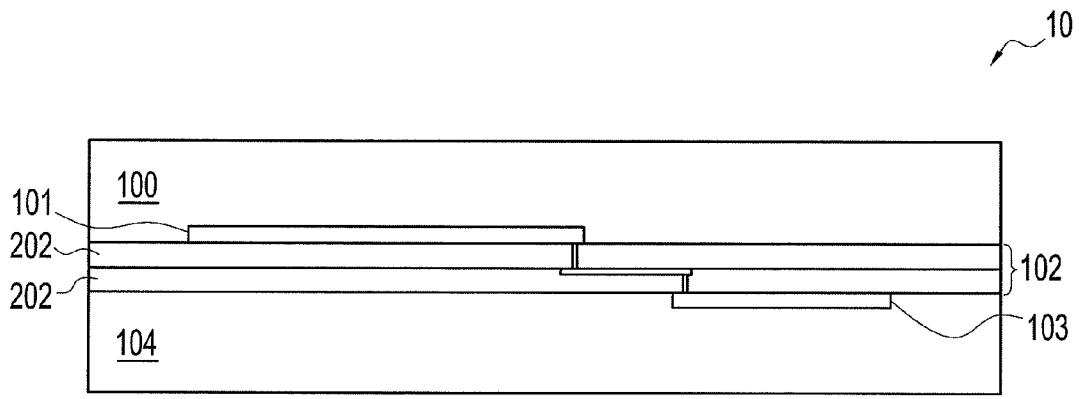

When used in a backside illuminated imager device, the structure 10 is flipped, as shown in FIG. 1B, so that the substrate 100 is at the top of the structure 10. The substrate 100 may be thinned by grinding, selective silicon etch, or any other suitable method. Thinning the substrate 100 allows more incident light from a source above the top surface of the flipped structure 10 to reach the arrayed photosensors of the pixel circuits within the imager circuitry 101.

The methods and structures described herein provide isolated top side bond pads which are connected to the buried bond pads 103 to enable connection of bond pads 103 with external circuits.

Figure 1C:
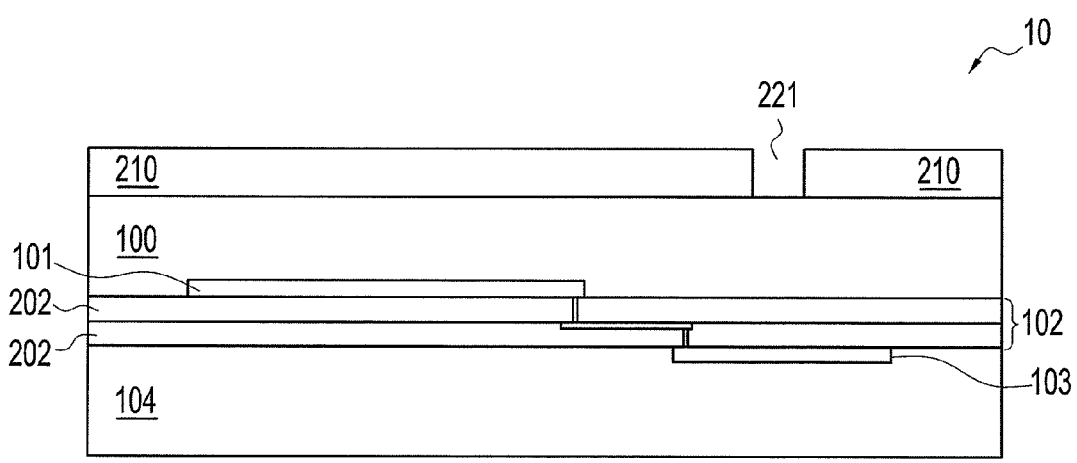
Figure 1D:
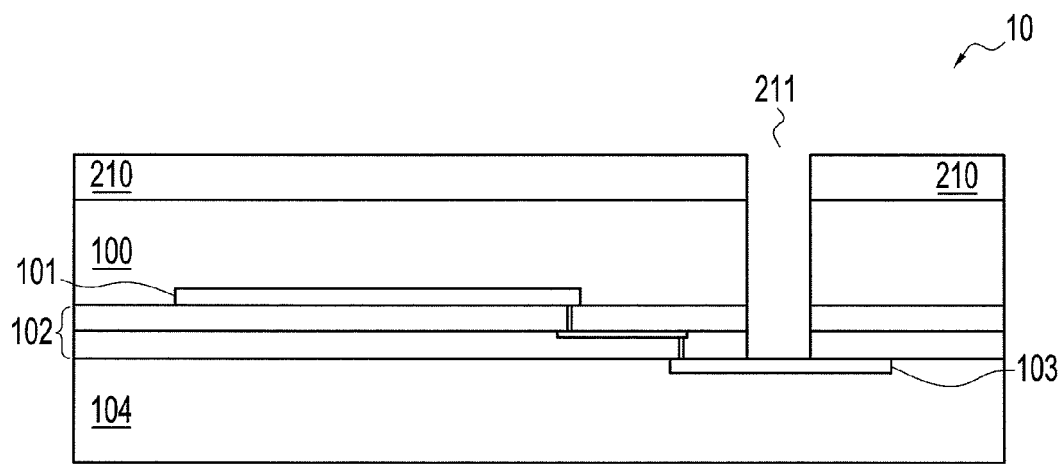
Figure 1E:
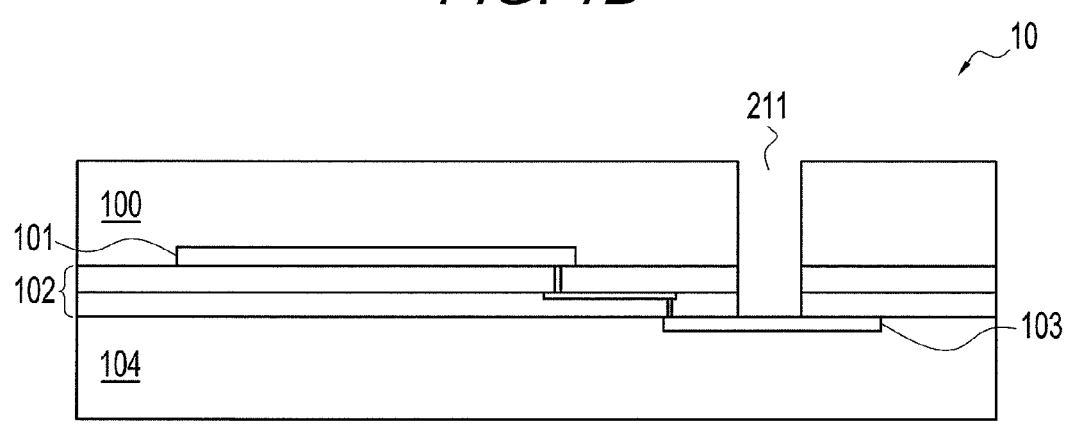

FIGS. 1C-1E illustrate a first method and structural embodiment. As shown in FIGS. 1C-1E, show the formation of a via 211 through the substrate 100 and the dielectric material 102, down to the electrically conductive bond pad 103. First, as shown in FIG. 1C, an etch mask 210 is formed with an opening 221 defined therein. The opening 221 may be any shape or size suitable for providing an etching path down to the bond pad 103. For example a circular opening with a 20 µm diameter may be formed. The etch mask 210 may be formed by any known or later developed technique, such as photolithographic techniques.

Once the etch mask 210 is formed, areas not covered by the etch mask 210 are removed by, for example, wet or dry chemical etching techniques. FIG. 1D illustrates the device structure after a via 211 has been etched into substrate 100 and dielectric material 102. The etch forms the via 211 down to the bond pad 103. After the etch is complete, the etch mask 210 is removed, for example by dissolving the photoresist materials forming the etch mask 210, planarizing the material down to the substrate 100, or by any other suitable method of removing an etch mask. FIG. 1E illustrates the structure with the etch mask 210 removed.

Figure 1F:
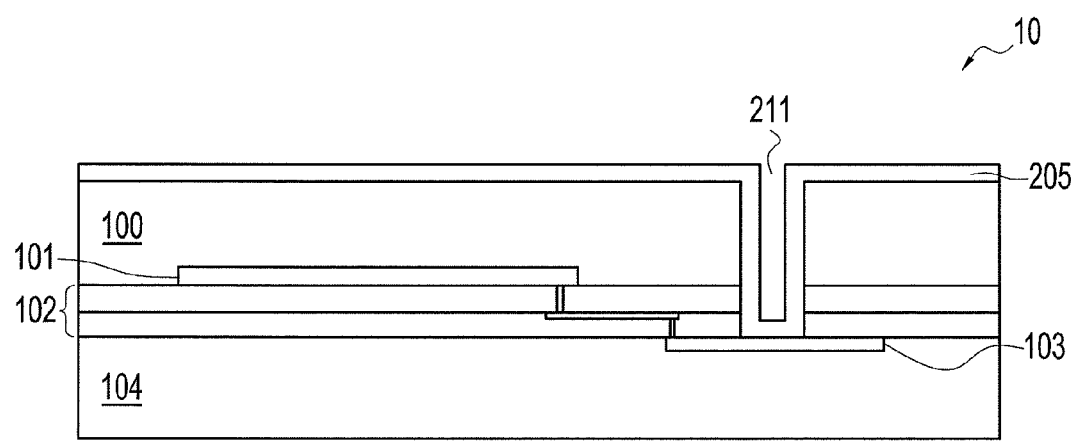

Next, as illustrated in FIG. 1F, a dielectric material 205 is formed on the exposed surfaces of the substrate 100, the dielectric material 102, and the bond pad 103. The dielectric material 205 may be formed using chemical vapor deposition (CVD), physical layer deposition (PVD), atomic layer deposition (ALD), or other known methods. The dielectric material 205 may either be grown on the exposed surfaces (as illustrated in FIG. 1F), or may be deposited to cover the surface of the substrate 100 and fill the via 211 (as discussed in more detail below with reference to FIG. 4F). Dielectric material 205 can be formed as an anti-reflective coating (ARC) material, which may be a composite dielectric such as an ONO material including a bottom silicon oxide material, a middle silicon nitride material, and a top silicon oxide material.

Figure 1G:
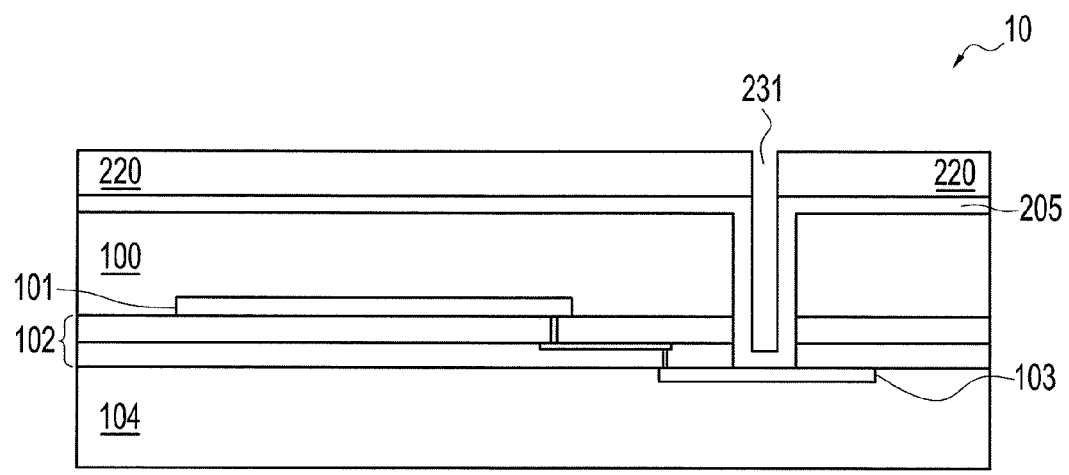
Figure 1H:
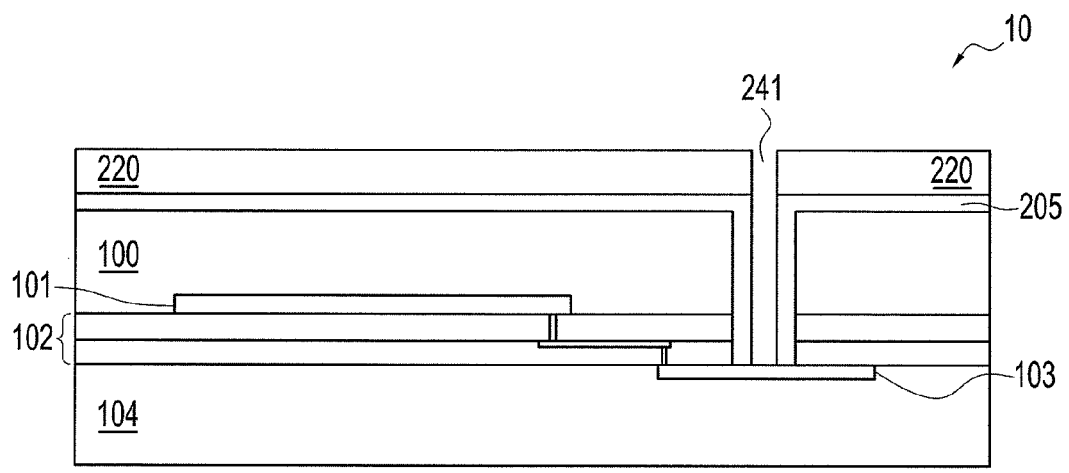
Figure 1I:
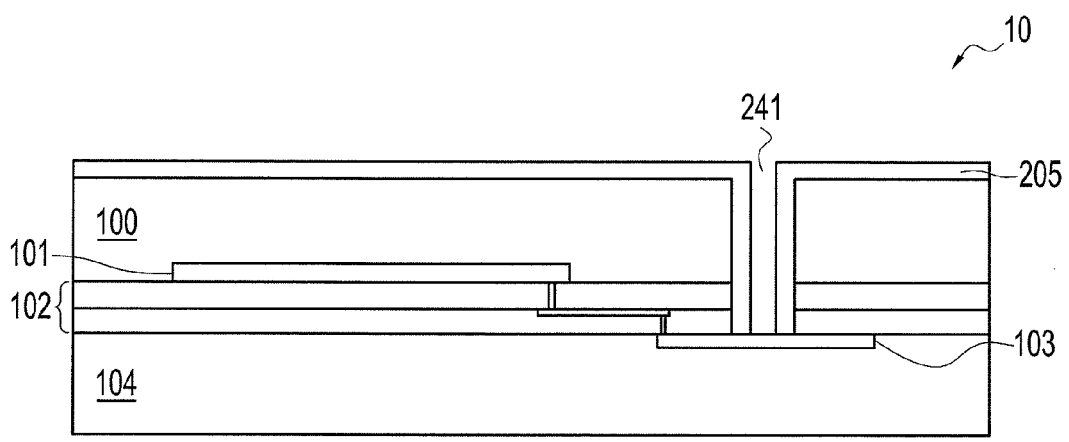

In FIG. 1G, an etch mask 220 is formed on the surface of the structure 10 over dielectric material 205. The etch mask 220 is formed with an opening 231 defined therein. The opening 231 is formed smaller than opening 221 (FIG. 1C) in the prior etch mask 210 so that, when an etch is performed, there will be a sufficient amount of dielectric 205 on the sides of the via 211 to electrically isolate a subsequently formed interconnect. The opening 231 may be, for example, a circular opening with a 10 µm diameter. FIG. 1H illustrates the structure 10 after etching the areas exposed by the etch mask 220 down to the bond pad 103 to create a via 241. As illustrated in FIG. 1H, the dielectric material that was in the via 241 above the bond pad 103 is removed, exposing a portion of the surface of the bond pad 103. FIG. 1I illustrates the structure 10 after the etch mask 220 is removed.

Figure 1J:
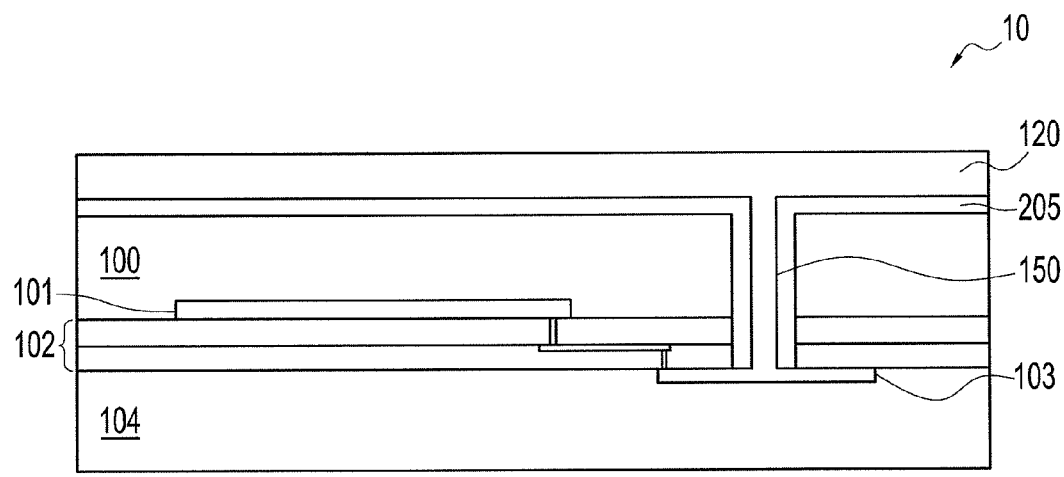

Next, as illustrated in FIG. 1J, a conductive material 120 is deposited over the surface of the structure 10, covering the dielectric material 205 and filling the via 241 down to the bond pad 103. Any electrically conductive material can be used, for example, a metal such as Ti, TiN, or Al or W or Cu along with a barrier metal, for example Ti, TiN, Ta, TaN. The conductive material 120 provides an electrically conductive interconnect 150 between the conductive material 120 on the surface of the backside illuminated imager device and the bond pad 103.

Figure 1K:
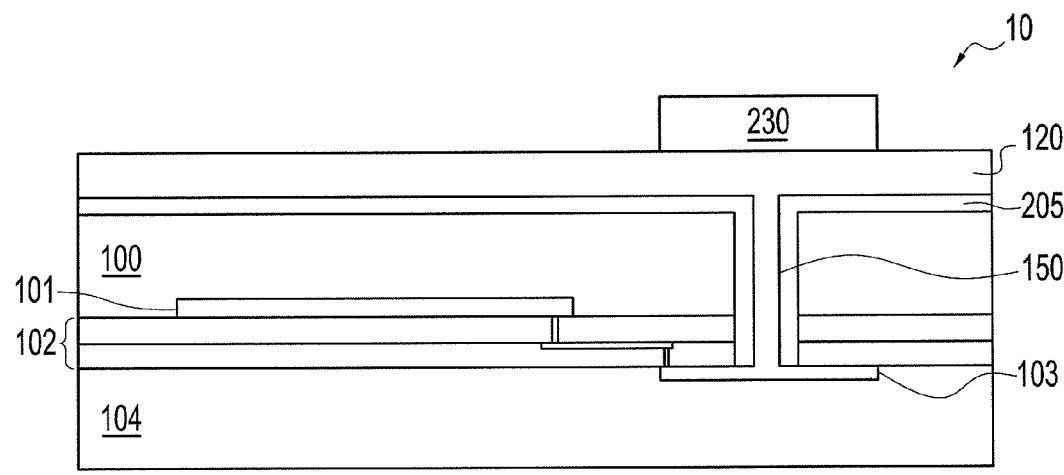
Figure 1L:
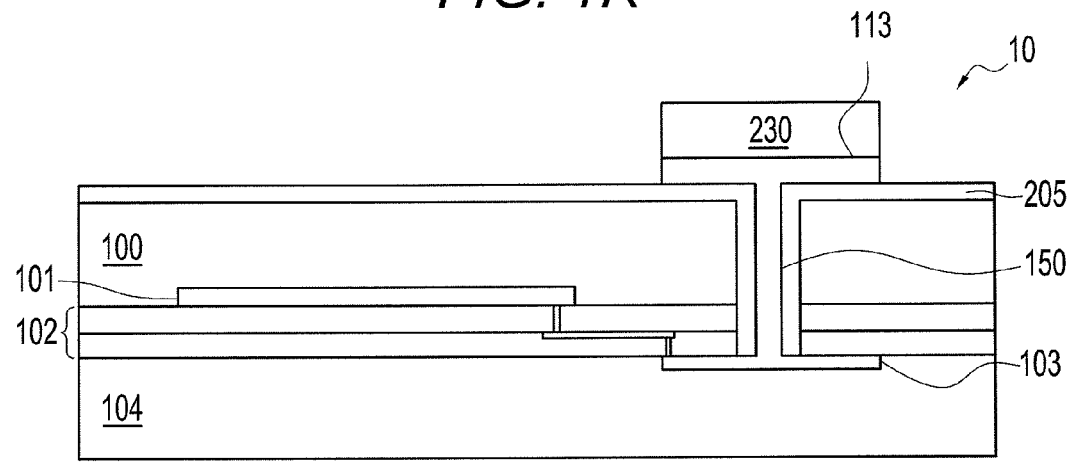

FIG. 1K illustrates an etch mask 230 formed on the surface of the structure 10. The etch mask 230 is formed at least partially over the conductive interconnect 150. As illustrated in FIG. 1L, an etch is performed to form a new bond pad 113 on the surface of the structure 10. The interconnect 150 connects the new bond pad 113 with buried bond pad 103. The dielectric material 205 electrically isolates the bond pad 113 and interconnect 150 from the substrate 100.

Figure 1M:
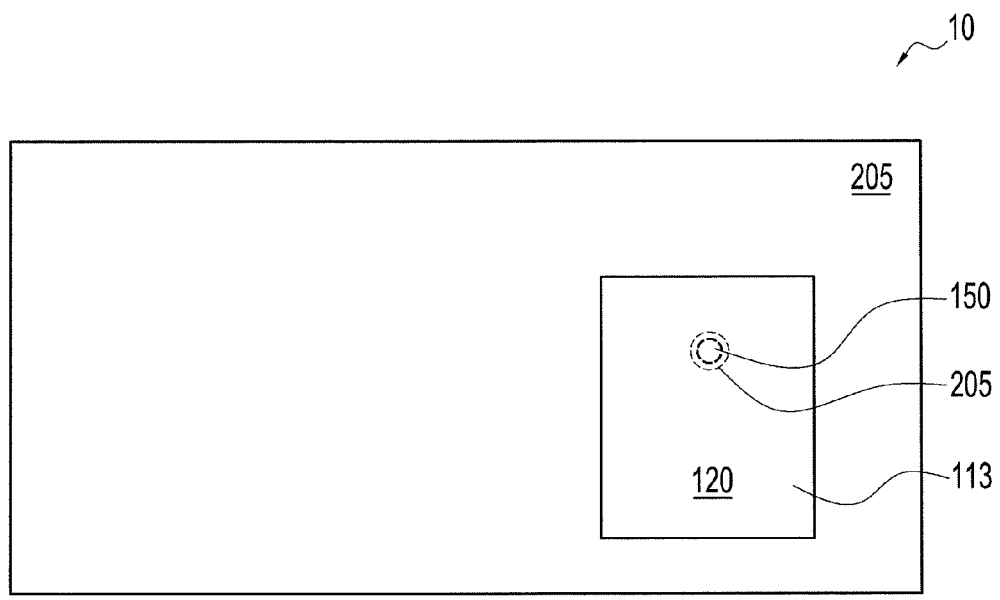
Figure 1N:
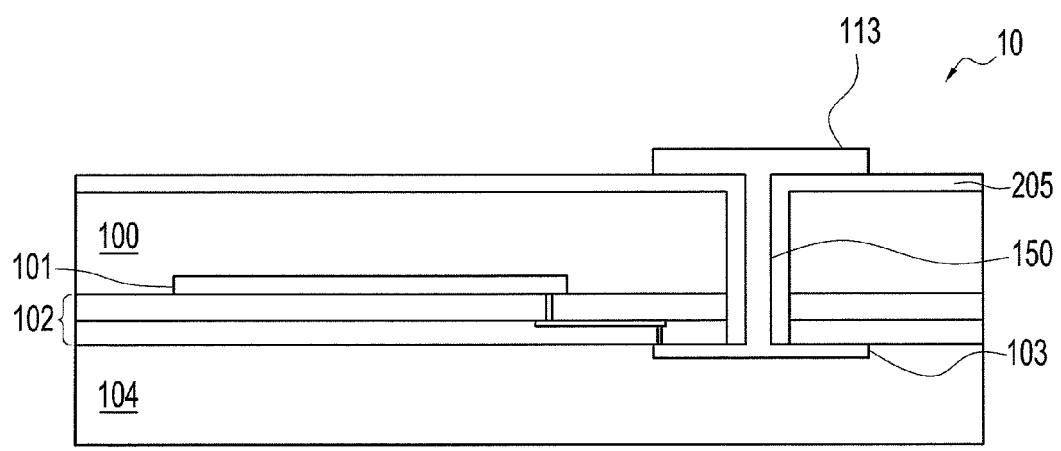

FIGS. 1M and 1N respectively illustrate top down and cross sectional views of the structure 10 of FIG. 1L after the etch mask 230 has been removed. In FIG. 1M, the interconnect 150 is illustrated as circular, but the interconnect 150 could be formed in any shape, such as a square or a rectangular trench. Additionally, multiple interconnects 150 may be formed, as described in more detail below. The bond pad 113 in FIGS. 1M-1N is illustrated as rectangular, but may be formed in any desired shape or size. The bond pad 113 may be formed to be substantially the same size as the buried bond pad 103, or may be larger or smaller, as desired. Similarly, the buried bond pad 103 may be formed larger or smaller than the relative size of the bond pad 103 illustrated in FIG. 1N.

Once the structure 10 is in the configuration illustrated in FIGS. 1M and 1N, the structure may be completed according to a first or second embodiment described below. The first embodiment is now described by way of example with reference to FIGS. 2A-2B.

Figure 2A:
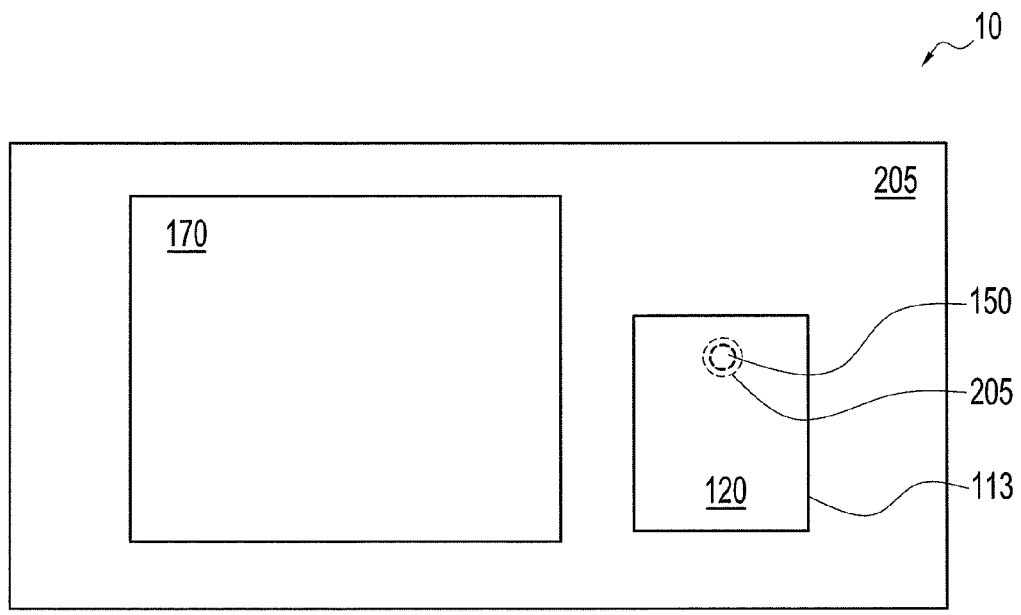
FIGS. 2A-2B illustrate in cross-section and top views the formation of a backside illuminated imager device in accordance with an embodiment described herein.
Figure 2B:
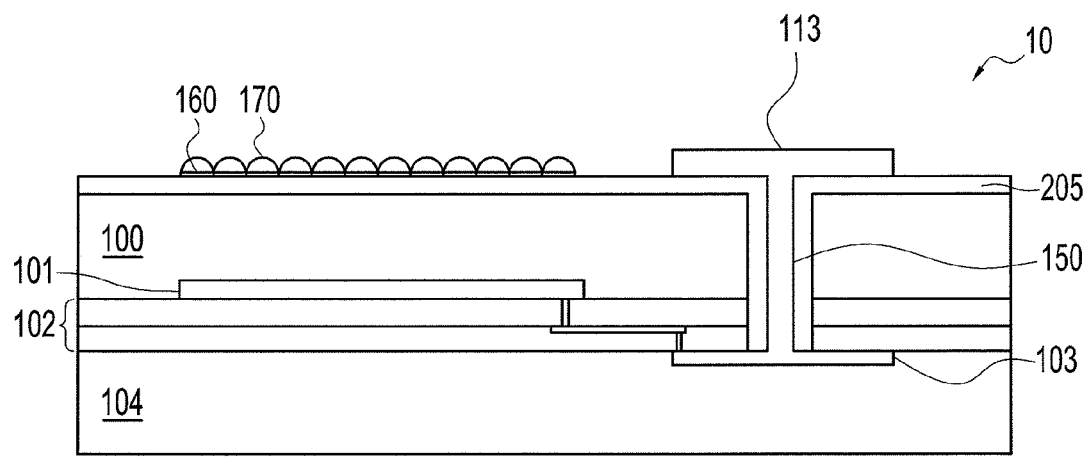

FIGS. 2A and 2B respectively illustrate top down and cross sectional views of a completed structure 10 for use in a backside illuminated imager device formed in accordance with the first embodiment. As illustrated in FIG. 2B, a color filter array (CFA) 160 is formed over the arrayed photosensors of the imager circuitry 101. The CFA 160 can include red, green, and blue color filters formed in a Bayer pattern, and can be formed using known photolithographic techniques. The color filters of the CFA 160 pass certain wavelengths of light while blocking others as known in the imaging art. As illustrated in FIGS. 2A and 2B, structure 10 also includes microlenses 170 formed above the CFA 160 to focus light onto the pixels of the imager circuitry 101. The color filter array 160 and microlenses 170 may be formed using spin-coating, printing, laminating, or other known techniques. The substantially flat surface of the dielectric material 205 facilitates formation of the CFA 160 and microlenses 170.

The bond pad 103 below the dielectric material 102 is connected to newly formed bond pad 113 on the surface of the structure 10 via the interconnect 150. The formed structure 10 has minimal surface features, while still providing an electrical connection to buried bond pad 103. The bond pad 103 may be electrically connected to the imager circuitry 101, as illustrated in FIG. 2B, or may be connected to other features of the structure 10 requiring an external electrical connection.

Figure 3A:
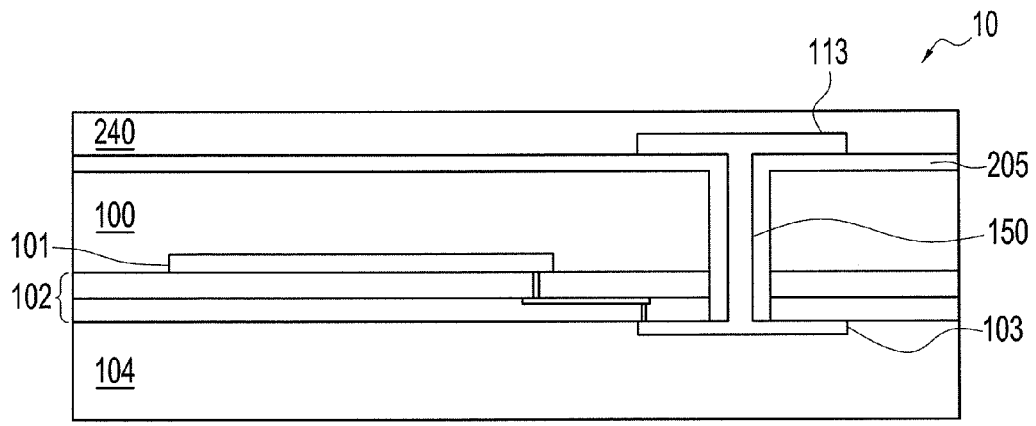
FIGS. 3A-3E illustrate in cross-section and top views the formation of a backside illuminated imager device in accordance with another embodiment described herein.
Figure 3B:
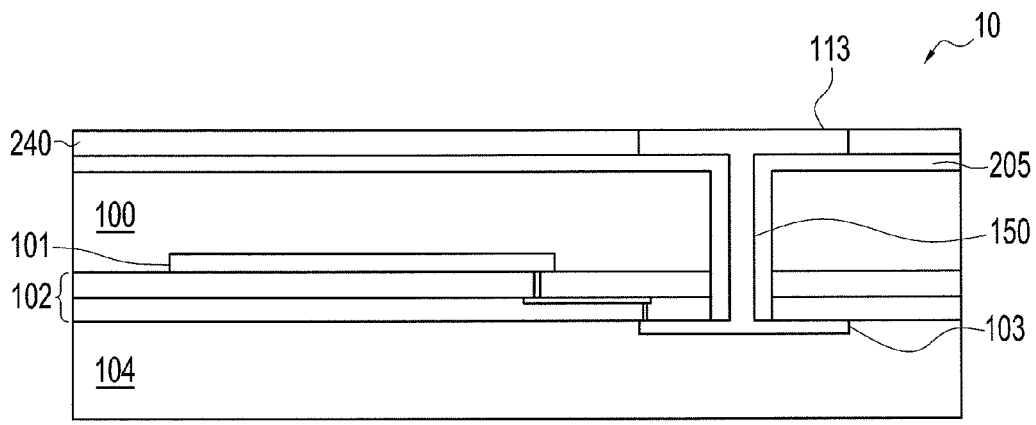
Figure 3C:
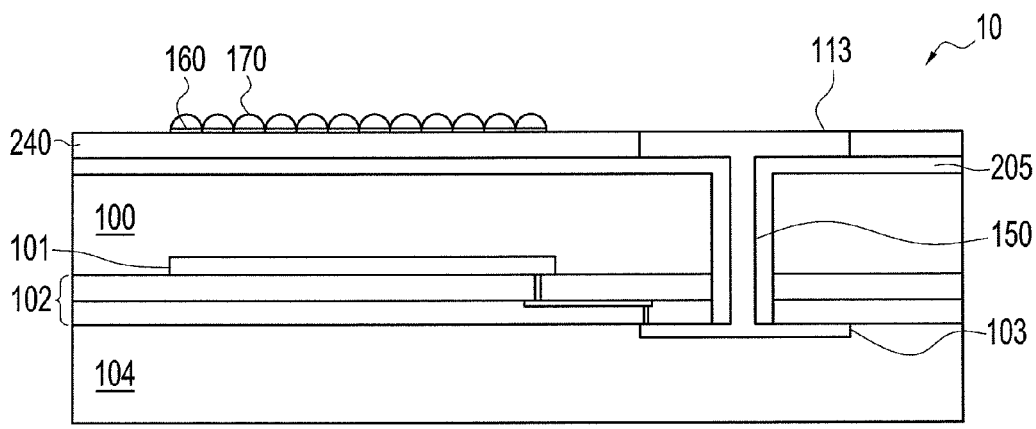

A second embodiment for completing the structure 10 of FIGS. 1M-1N is now described with reference to FIGS. 3A-3E. In the second embodiment, as illustrated in FIG. 3A, a dielectric material 240 is deposited over the structure 10. The dielectric material 240 may be, for example, a spin on dielectric (SOD), a screen print dielectric, a CVD deposited dielectric, or any other suitable dielectric material deposited using any suitable method. After the dielectric material 240 is deposited, any dielectric material 240 above bond pad 113 is removed, as illustrated in FIG. 3B. In FIG. 3C, a CFA 160 and microlenses 170 are foamed over the dielectric material 240 above the photosensors within imager circuitry 101.

Figure 3D:
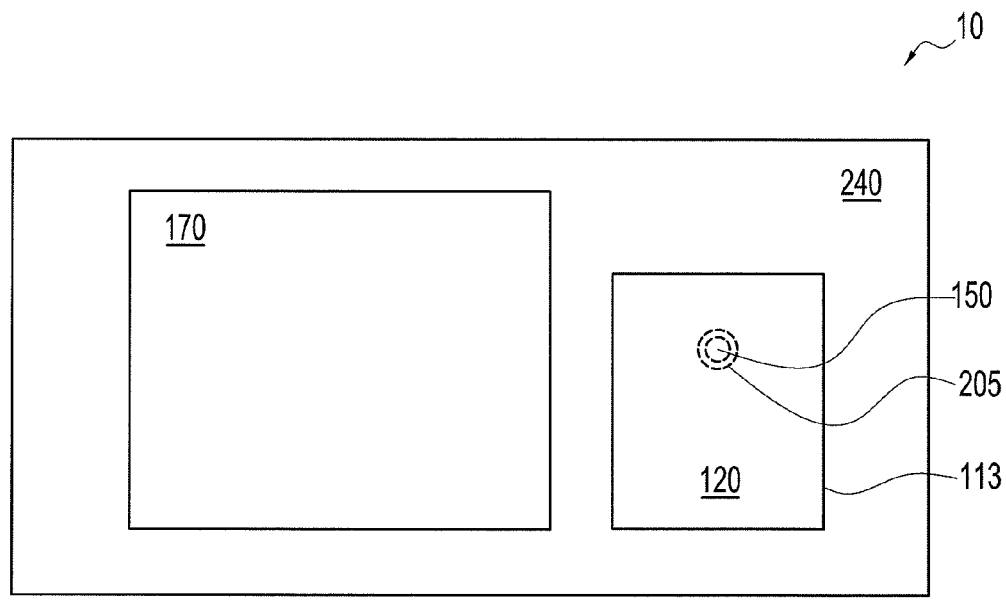
Figure 3E:
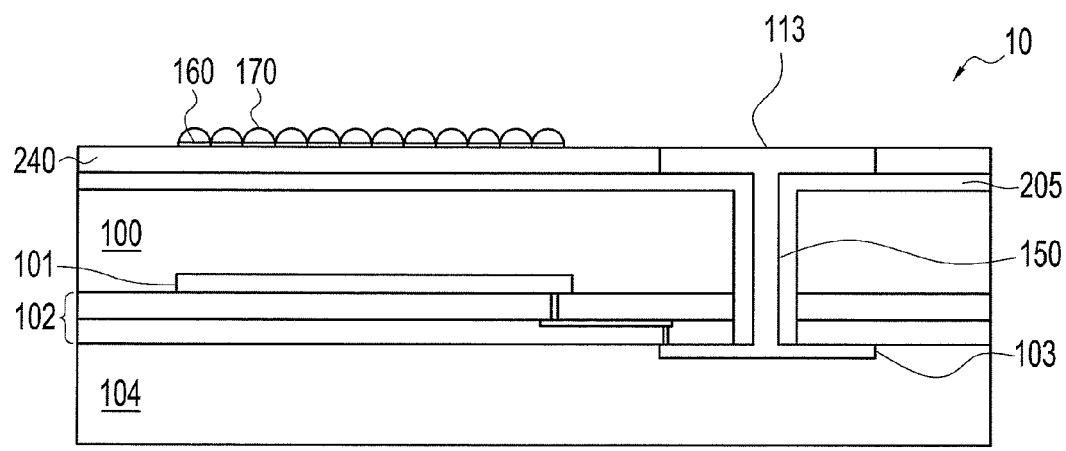

FIGS. 3D and 3E illustrate in top down and cross sectional views a completed structure 10 for use in a backside illuminated imager device formed in accordance with the second embodiment. The structure 10 is formed with a CFA 160 and microlenses 170 over photosensors within imager circuitry 101. The bond pad 103 below the dielectric material 102 is connected to newly formed bond pad 113 on the surface of the structure 10 via the interconnect 150. The bond pad 113 and the interconnect 150 are electrically isolated by the dielectric material 205. The formed structure 10 has minimal surface features, while still providing an electrical connection to bond pad 103.

There are advantages and disadvantages of the first and second embodiment illustrated in FIGS. 2A-2B and 3A-3E, respectively. As shown in FIG. 3E, the completed structure 10 in accordance with the second embodiment has even less surface topography than the structure 10 of the first embodiment (illustrated in 2B). On the other hand, in the FIG. 3E structure 10, light must pass through an additional layer of dielectric material 240 before reaching imager circuitry 101, thus decreasing efficiency. Accordingly, one method or the other may be suitable for different applications.

Figure 4A:
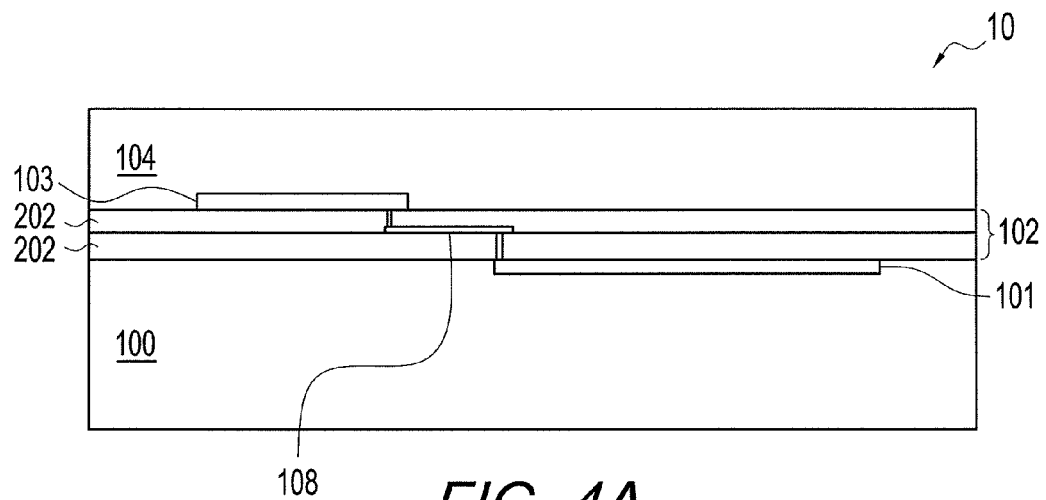
FIGS. 4A-4N Illustrate in cross-section and top views the formation of electrical bond pads connected via an electrically isolated electrical interconnect that is surrounded by an electrically isolated region in accordance with another embodiment described herein.
Figure 4B:
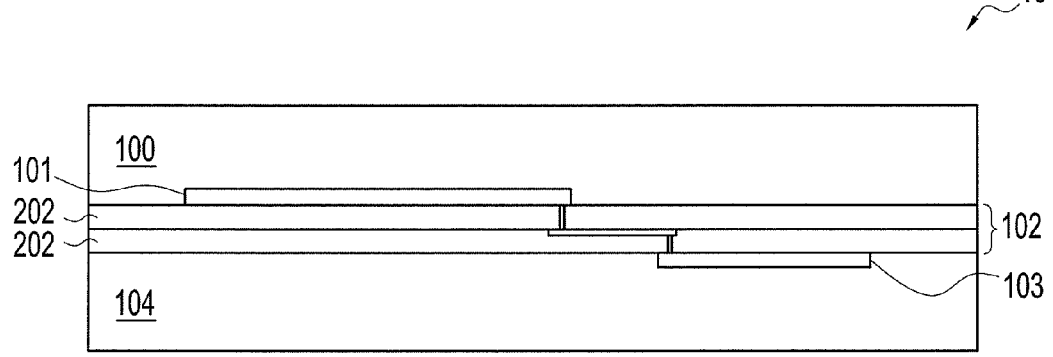
Figure 4C:
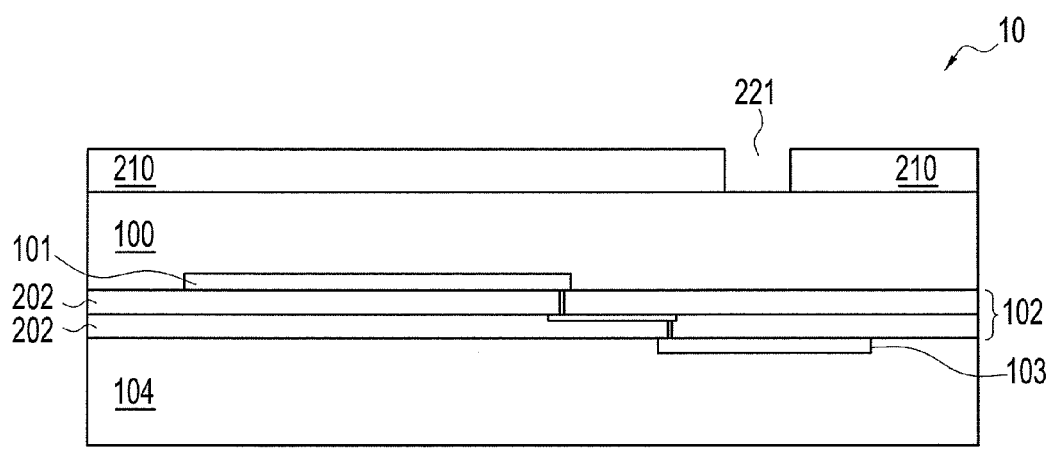
Figure 4D:
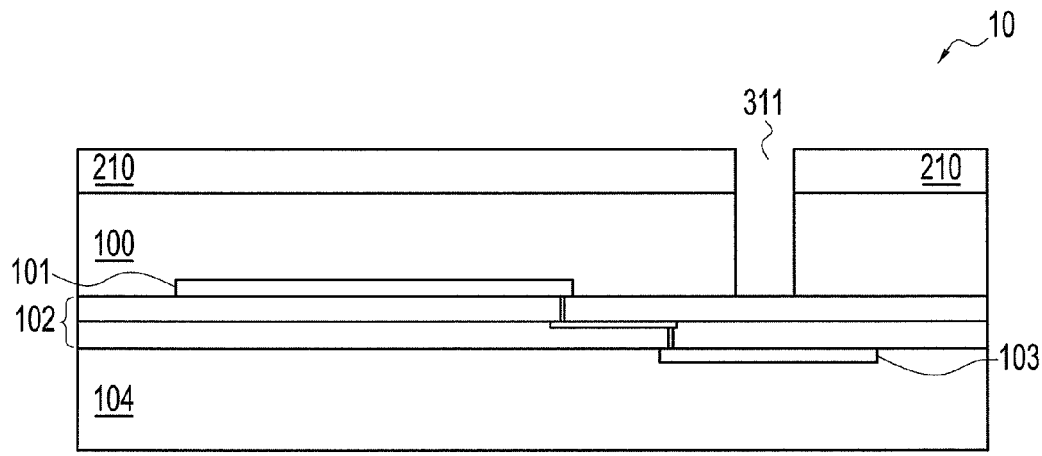
Figure 4E:
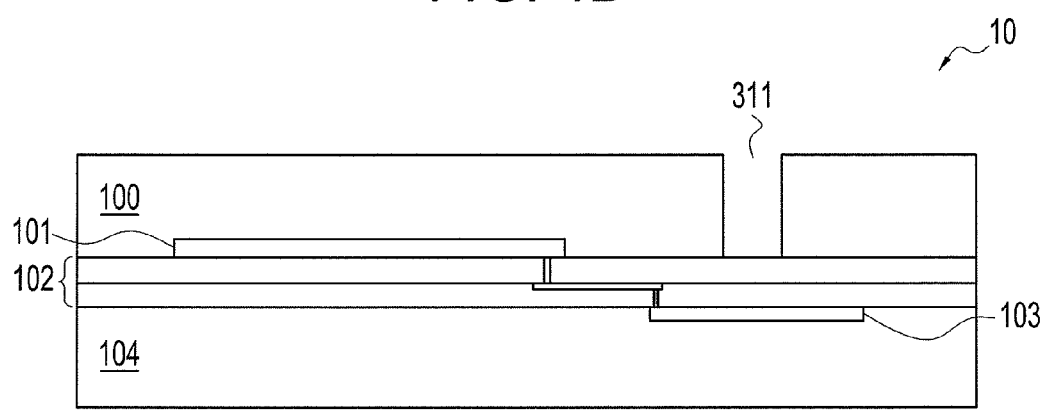
Figure 4F:
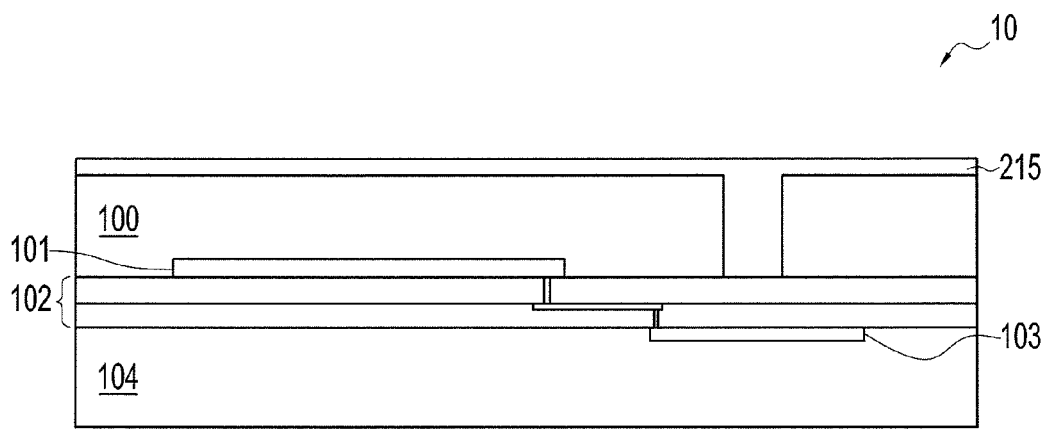
Figure 4G:
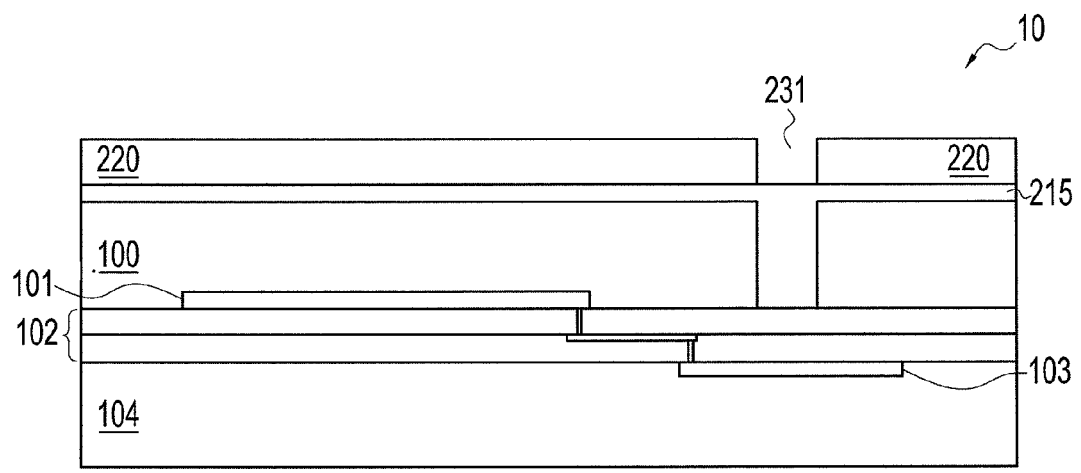
Figure 4H:
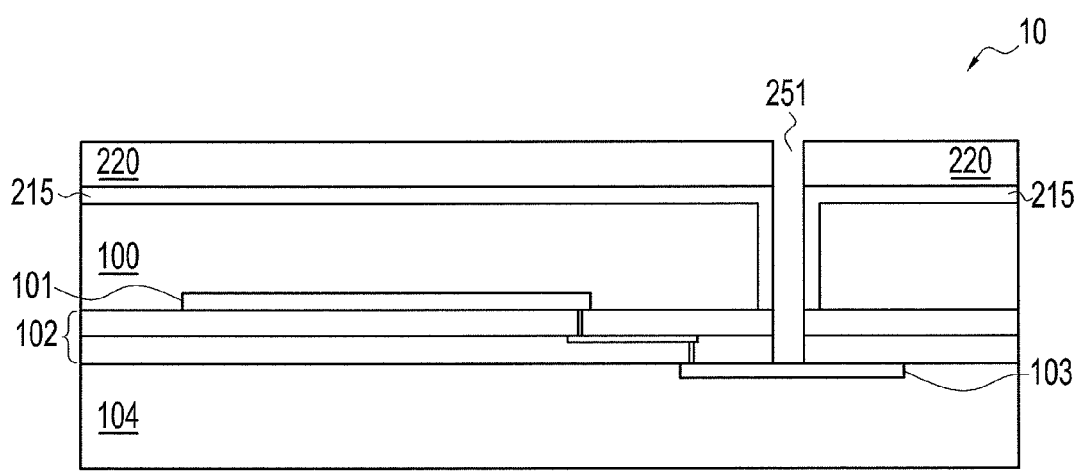
Figure 4I:
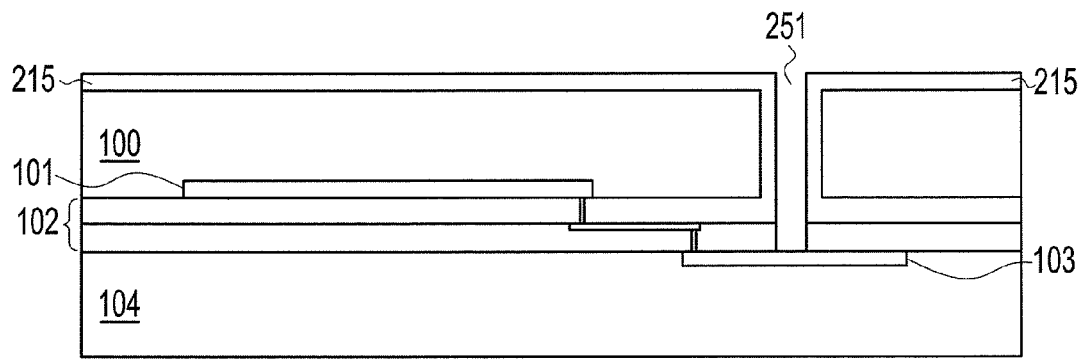
Figure 4J:
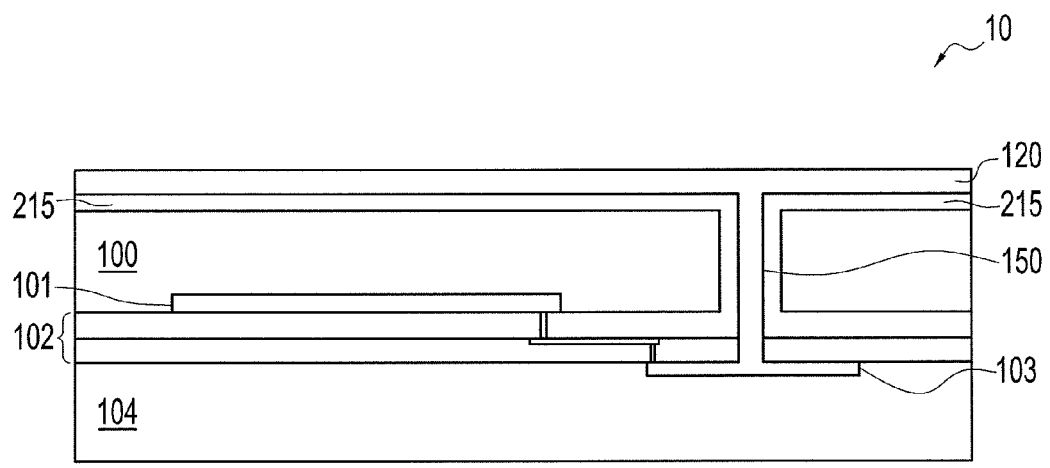
Figure 4K:
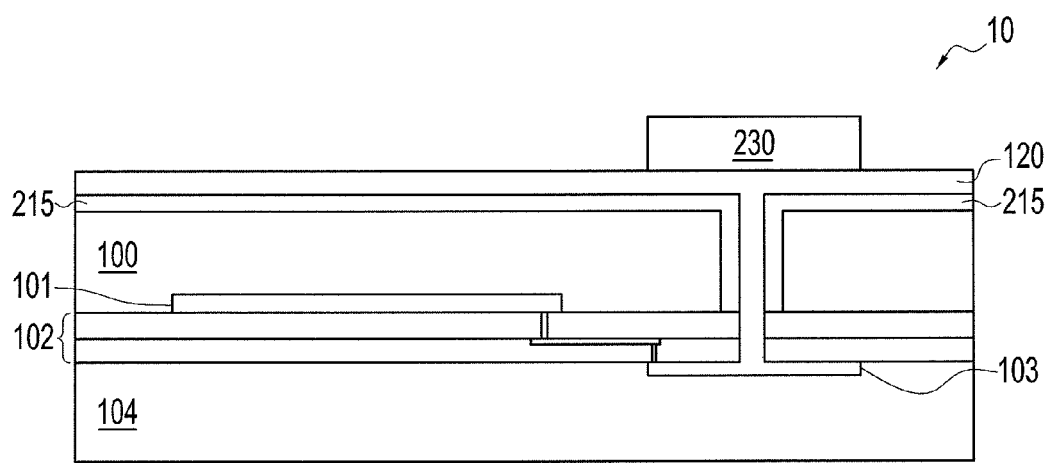
Figure 4L:
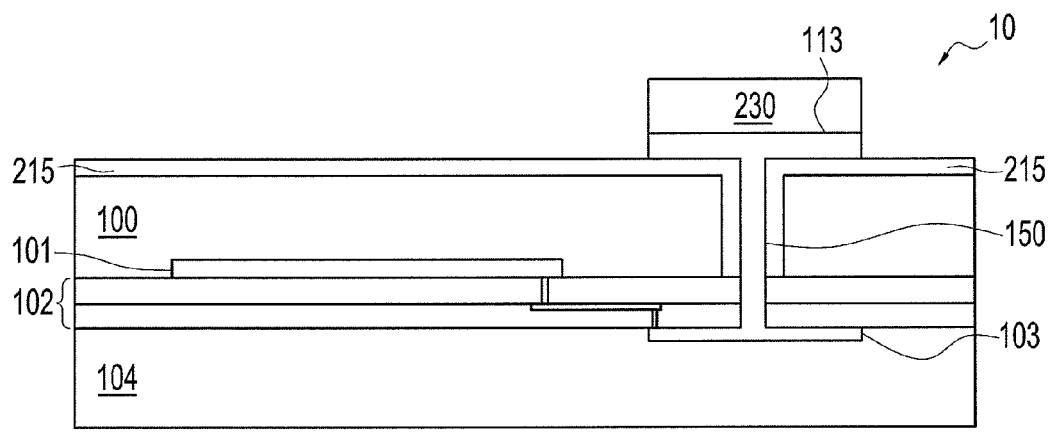
Figure 4M:
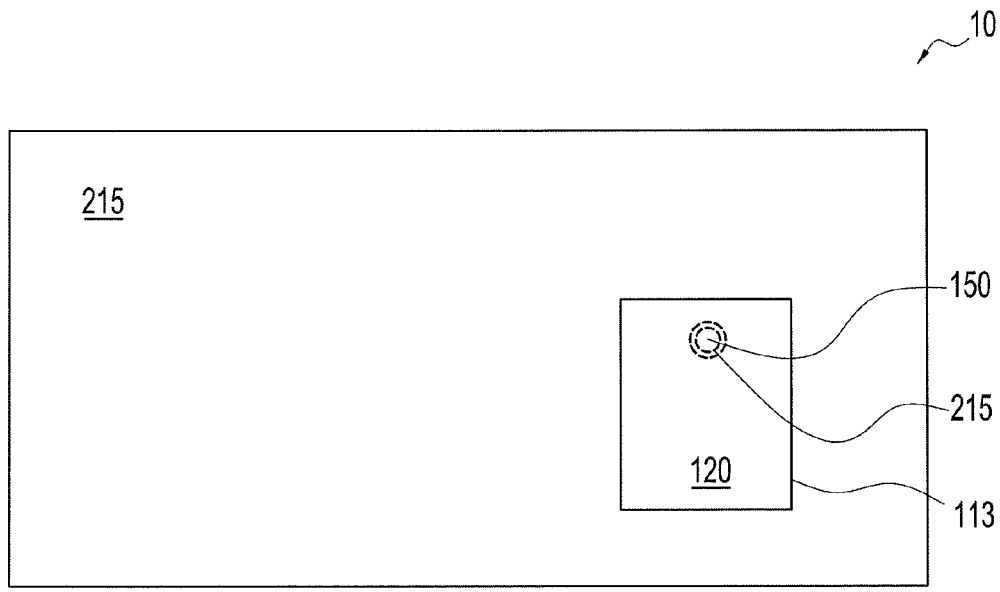
Figure 4N:
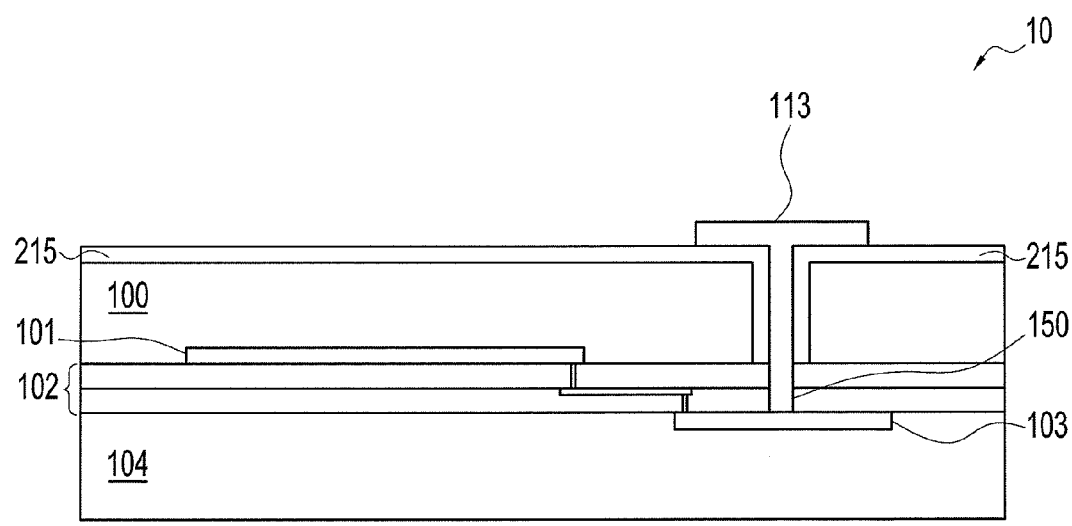

FIGS. 4A-4N illustrate a third embodiment of the invention. In this embodiment, the formation of a via down to the buried bond pad 103 is performed at a later stage, so that the bond pad 103 is exposed to fewer processing steps. FIG. 4A illustrates an example structure 10 for a backside illuminated imager device. As shown in FIG. 4A, the embodiment begins, similar to the FIG. 1A embodiment, with a structure 10 that has been formed with a substrate 100 such as a semiconductor substrate, e.g., a silicon substrate. Imager circuitry 101 is formed on substrate 100 and includes pixel circuits each containing a photosensor and other pixel circuitry, as well as array readout and signal processing circuits. The substrate may be a silicon substrate or any other suitable substrate. Dielectric material 102 is formed over the substrate 100 and the imager circuitry 101, and an electrically conductive bond pad 103 is formed over the dielectric material 102. The dielectric material 102 and bond pad 103 are covered by a permanent carrier 104, which causes bond pad 103 to be buried within the substrate 100. The permanent carrier 104 can be attached to the dielectric material 102 of the structure by oxide-to-oxide bonding or oxide-polymer bonding or other known methods.

Dielectric material 102 may include multiple layers of interlayer dielectric material 202, such as borophosphosilicate glass (BPSG) or an oxide, interspersed with conductive material that forms electrical connections to various components of the imager circuitry 101. For example, FIG. 4A illustrates an example electrical connection 108 formed between the imager circuitry 101 and the electrically conductive bond pad 103. This electrical connection 108 may be used to provide signal paths used to operate the imager device circuitry, for example, for controlling the imager circuitry 101 or reading out charges acquired by the arrayed photosensors which are electrically connected to imager circuitry 101. The dielectric material 102 may include many such electrical connections to various electrical connection points of the structure 10 interspersed between interlayer dielectric material 202 (as described in more detail below in reference to FIG. 11).

When used in a backside illuminated imager device, the structure 10 is flipped, as shown in FIG. 4B, so that the substrate 100 is at the top of the structure 10. The substrate 100 may be thinned by grinding, selective silicon etch, or any other suitable method. Thinning the substrate 100 allows more incident light from a source above the top surface of the flipped structure 10 to reach the arrayed photosensors of the pixel circuits within the imager circuitry 101. FIG. 4B represents an embodiment of a structure 10 for use in a backside imager device, but other designs are possible without departing from the scope of the invention.

FIGS. 4C-4E illustrate the formation of a via 311 in the substrate 100 down to the electrically conductive bond pad 103. First, in FIG. 4C, an etch mask 210 is formed with an opening 221 defined therein. The opening 221 may be any shape or size suitable for providing an etching path down to the dielectric material 102. For example a circular opening with a 20 μm diameter may be formed. The etch mask 210 may be formed by any known or later developed technique, such as photolithographic techniques.

Once the etch mask 210 is formed, areas not covered by the etch mask 210 are removed by, for example, wet or dry chemical etching techniques. FIG. 4D illustrates the device structure after the via 311 has been etched into substrate 100. In this embodiment, the etch forms the via 311 down to the dielectric material 102. Unlike the first and second embodiments, the via 311 is not formed down to the bond pad 103. This means that the bond pad 103 is not exposed until later in the process, which limits contamination of the bond pad 103 by etch chemistries. After the etch is complete, the etch mask 210 is removed, for example by dissolving the photoresist materials forming the etch mask 210, by planarizing the material down to the dielectric material 205, or by any other suitable method of removing an etch mask. FIG. 4E illustrates the structure with the etch mask 210 removed.

Next, as illustrated in FIG. 4F, a dielectric material 215 is formed on the exposed surfaces of the substrate 100 and the dielectric material 102. The dielectric material 215 may be formed using chemical vapor deposition (CVD), physical layer deposition (PVD), atomic layer deposition (ALD), or other known means. The dielectric material 215 may either be grown on the exposed surfaces, including the sidewall surfaces of the via 311 (similar to the technique illustrated in FIG. 1E), or may be deposited to cover the surface of the substrate 100 and fill the via 311, as illustrated in FIG. 4F. Either of the methods of forming the dielectric material 215 (illustrated in FIGS. 1E and 4F, respectively) may be applied to any of the first, second, and third embodiments. Dielectric material 215 can be an anti-reflective coating (ARC) material, which may be a composite dielectric such as an ONO material including a bottom silicon oxide material, a middle silicon nitride material, and a top silicon oxide material.

In FIG. 4G, an etch mask 220 is formed on the surface of the structure 10. The etch mask 220 is formed with an opening 231 defined therein. The opening 231 is formed smaller than opening 221 (FIG. 4C) in the prior etch mask 210 so that, when an etch is performed, there will be a sufficient amount of dielectric material 215 on the sides of the via 211 to electrically isolate a subsequently formed interconnect. The opening 231 may be, for example, a circular opening with a 10 µm diameter. FIG. 4H illustrates the structure 10 after etching the areas exposed by the etch mask 220 to form via 251 down to the bond pad 103. As illustrated in FIG. 4H, the dielectric material 215 in the opening 231 that is above the bond pad 103 is removed, exposing the bond pad 103. In this embodiment, this step is the first time that the bond pad 103 is exposed by etch. By forming the prior via 311 only down to dielectric material 102, the bond pad 103 is spared exposure to multiple etch steps. Since dielectric material 102 will electrically isolate lower portions of an interconnect 150, it is not necessary to form the dielectric 215 at the layer of dielectric material 102. FIG. 4I illustrates the structure 10 after the etch mask 220 is removed.

Next, as illustrated in FIG. 4J, a conductive material 120 is deposited over the surface of the structure 10, covering the dielectric 215 and filling the via 251 down to the bond pad 103. Any electrically conductive material can be used, for example, a metal such as Ti, TiN, or Al or W or Cu along with a barrier metal, for example Ti, TiN, Ta, TaN. The conductive material 120 provides an electrically conductive interconnect 150 between the conductive material 120 on the surface of the backside illuminated imager device and the bond pad 103.

FIG. 4K illustrates an etch mask 230 formed on the surface of the structure 10. The etch mask 230 is formed at least partially over the conductive interconnect 150. As illustrated in FIG. 4L, an etch is performed to form a new bond pad 113. The interconnect 150 connects the new bond pad 113 with buried bond pad 103. The dielectric material 215 electrically isolates the bond pad 113 and interconnect 150 from the substrate 100.

FIGS. 4M and 4N respectively illustrate top down and cross sectional views of the structure 10 after the etch mask 230 has been removed. In FIG. 4M, the interconnect 150 is illustrated as circular, but the interconnect 150 could be formed in any shape, such as a square or a rectangular trench. Additionally, multiple interconnects 150 may be formed, as described in more detail below. The bond pad 113 in FIGS. 1M-1N is illustrated as rectangular, but may be formed in any desired shape or size. The bond pad 113 may be formed to be substantially the same size as the buried bond pad 103, or may be larger or smaller, as desired. Similarly, the buried bond pad 103 may be formed larger or smaller than the relative size of the bond pad 103 illustrated in FIG. 4N.

The structure 10 in FIGS. 4M and 4N may be completed by adding a CFA 160 and microlenses 170 according to the process described in reference to FIGS. 2A-2B or the process described in reference to FIGS. 3A-3E.

Figure 5A:
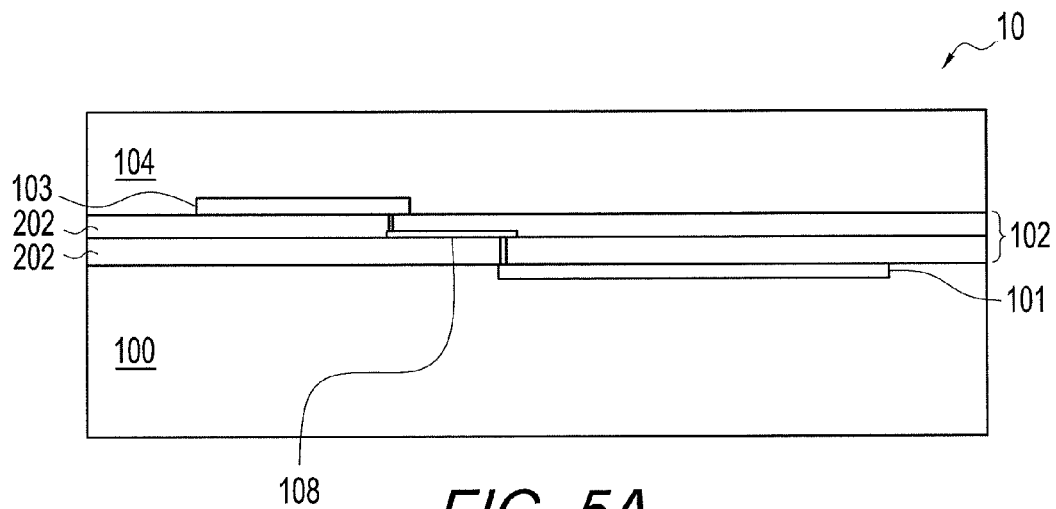
FIGS. 5A-5L illustrate in cross-section and top views the formation of electrical bond pads connected via an electrical interconnect in accordance with another embodiment described herein.

Referring to FIG. 5A, another embodiment is now described with reference to the fabrication of a structure for use in imager device fabrication, wherein like reference numbers are used consistently for like features throughout the drawings. This embodiment uses a trench-filled dielectric to isolate the interconnect, instead of the sidewall passivation technique described in the above embodiments.

FIG. 5A illustrates an example structure 10 for a backside illuminated imager device. As shown in FIG. 5A, the embodiment begins with a structure 10 that has been formed with a substrate 100 such as a semiconductor substrate, e.g., a silicon substrate. Imager circuitry 101 is formed on substrate 100 and includes pixel circuits each containing a photosensor and other pixel circuitry, as well as array readout and signal processing circuits. The substrate may be a silicon substrate or any other suitable substrate. Dielectric material 102 is formed over the substrate 100 and the imager circuitry 101, and an electrically conductive bond pad 103 is formed over the dielectric material 102. The dielectric material 102 and bond pad 103 are covered by a permanent carrier 104 which causes bond pad 103 to be buried within the substrate 100. The permanent carrier 104 is attached to the dielectric material 102 of the structure 10 by oxide-to-oxide bonding or oxide-polymer bonding or other known methods Dielectric material 102 may include multiple layers of interlayer dielectric material 202, such as borophosphosilicate glass (BPSG) or an oxide, interspersed with conductive material that forms electrical connections to various components of the imager circuitry 101. For example, FIG. 5A illustrates an example electrical connection 108 formed between the imager circuitry 101 and the electrically conductive bond pad 103. This electrical connection 108 may be used for controlling the imager circuitry 101 or reading out charges acquired by the arrayed photosensors which are electrically connected to imager circuitry 101. The dielectric material 102 may include many such electrical connections to various electrical connection points of the structure 10 interspersed between interlayer dielectric material 202 (as described in more detail below in reference to FIG. 11).

Figure 5B:
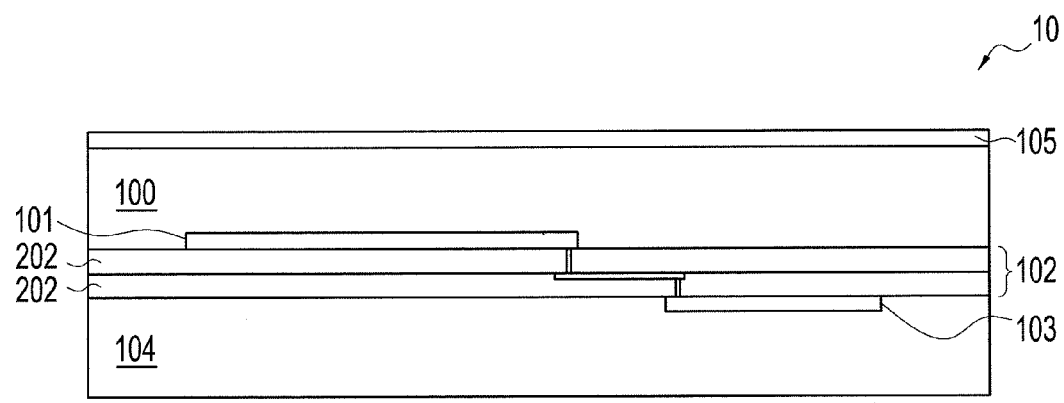

When used in a backside illuminated imager device, the structure 10 is flipped, as shown in FIG. 5B, so that the substrate 100 is at the top of the structure 10. The substrate 100 may be thinned by grinding, selective silicon etch, or any other suitable method. Thinning the substrate 100 allows more incident light from a source above the top surface of the flipped structure 10 to reach the arrayed photosensors of the pixel circuits within the imager circuitry 101. After the substrate 100 is thinned, it is covered by an anti-reflective coating (ARC) 105. The ARC 105 may be a composite dielectric such as an ONO material including a bottom silicon oxide material, a middle silicon nitride material, and a top silicon oxide material. FIG. 5B represents an embodiment of a structure 10 for use in a backside imager device, but other designs are possible without departing from the scope of the invention.

Figure 5C:
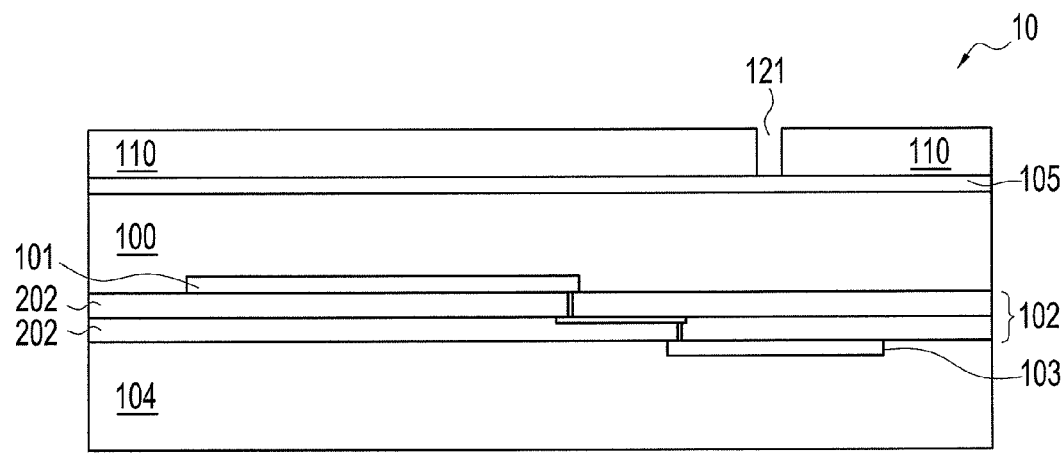
Figure 5D:
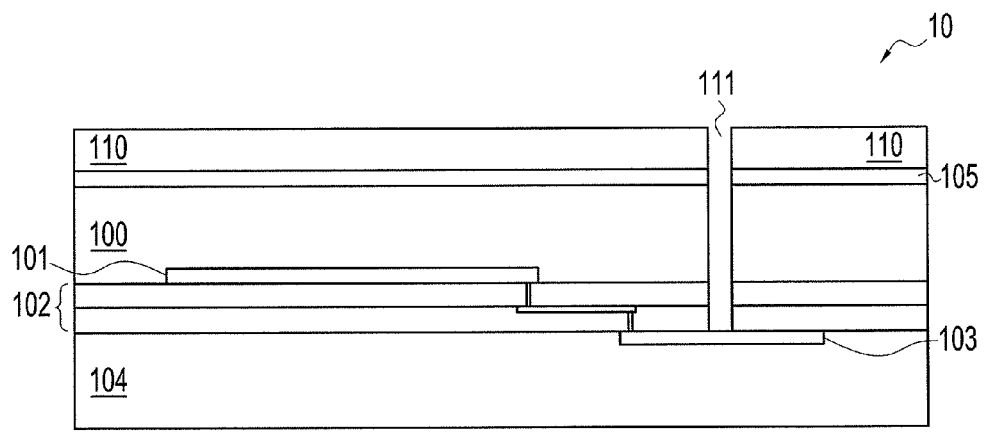
Figure 5E:
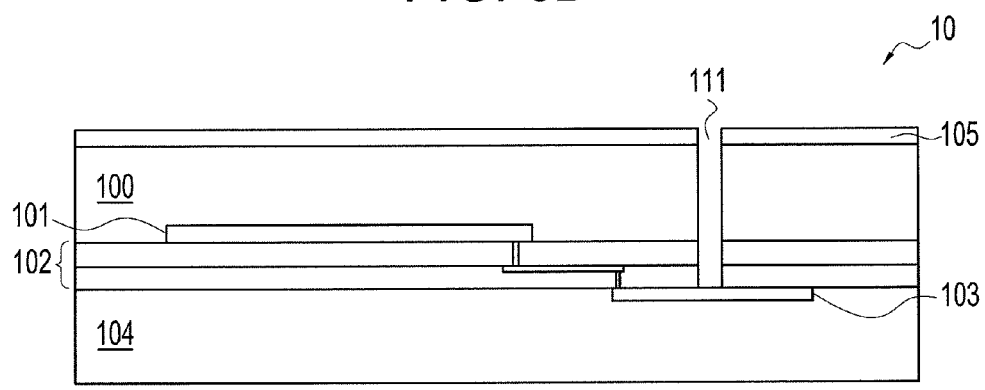

FIGS. 5C-5E illustrate the formation of a via 111 in the ARC 105, the substrate 100, and the dielectric material 102, down to the electrically conductive bond pad 103. First, in FIG. 5C, an etch mask 110 is formed with an opening 121 defined therein. The opening 121 may be any shape or size suitable for providing an etching path down to the bond pad 103. For example a circular opening with a 10 µm diameter may be formed. The etch mask 110 may be formed by any known or later developed technique, such as photolithographic techniques.

Once the etch mask 110 is formed, areas not covered by the etch mask 110 are removed by, for example, wet or dry chemical etching techniques. FIG. 5D illustrates the device structure after the via 111 has been etched into the ARC 105, substrate 100, and dielectric material 102. The etch forms the via 111 down to the bond pad 103. After the etch is complete, the etch mask 110 is removed, for example by dissolving the photoresist materials forming the etch mask 110, by planarizing the material down to the ARC 105, or by any other suitable method of removing an etch mask. FIG. 5E illustrates the structure with the etch mask 110 removed.

Figure 5F:
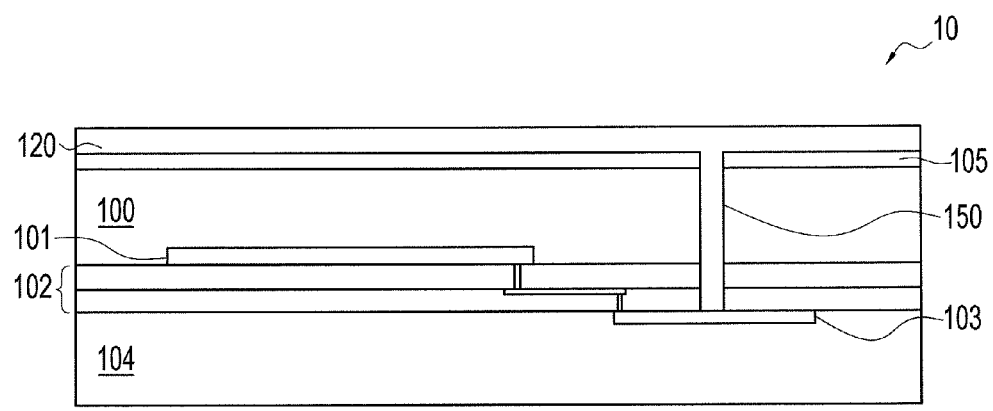

Next, as illustrated in FIG. 5F, a conductive material 120 is deposited over the surface of the structure 10, covering the ARC 105 and filling the via 111 down to the bond pad 103. Any electrically conductive material can be used, for example, a metal such as Ti, TiN, or Al or W or Cu along with a barrier metal, for example Ti, TiN, Ta, TaN. The conductive material 120 provides an electrically conductive interconnect 150 between the conductive material 120 on the surface of the backside illuminated imager device and the bond pad 103.

Figure 5G:
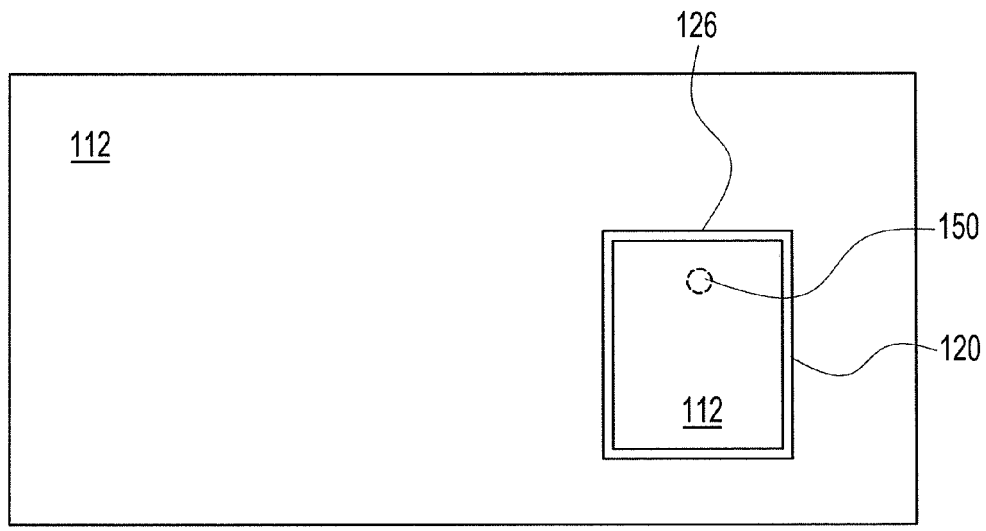
Figure 5H:
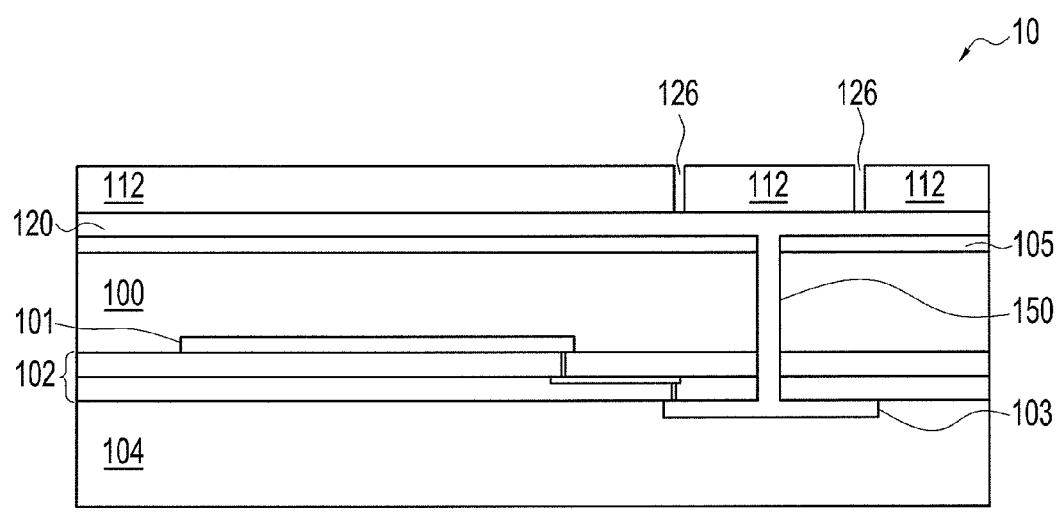

FIGS. 5G and 5H respectively illustrate top down and cross sectional views of the FIG. 5F structure 10, now covered by an etch mask 112. In FIG. 5G, the interconnect 150 is illustrated as circular, but the interconnect 150 could be formed in any shape, such as a square. Additionally, multiple interconnects 150 may be formed. An etch mask 112 that includes a trench opening 126 forming a rectangle when viewed from the top down is formed over the conductive material 120. The etch mask 112 may be formed by any now known or later developed techniques, including photolithographic techniques.

Figure 5I:
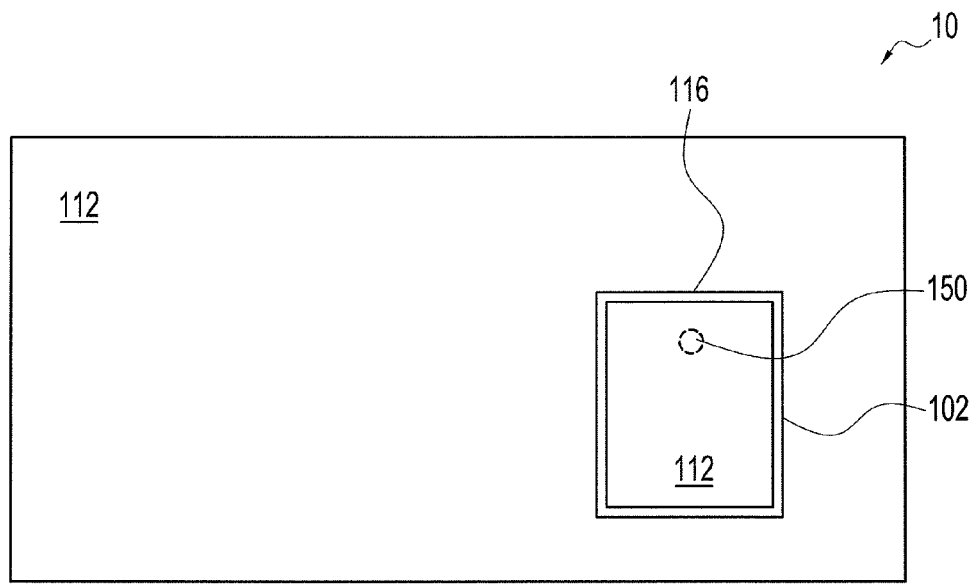
Figure 5J:
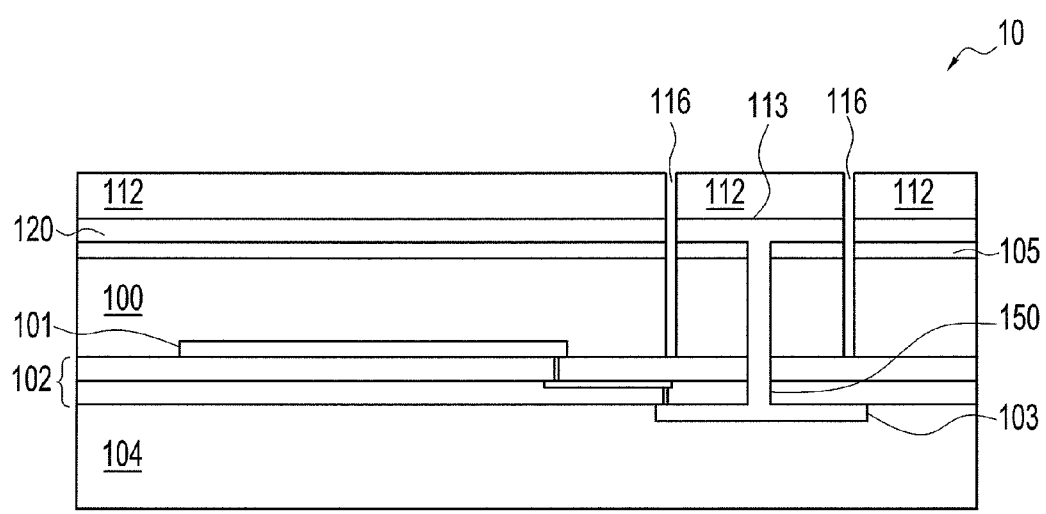
Figure 5K:
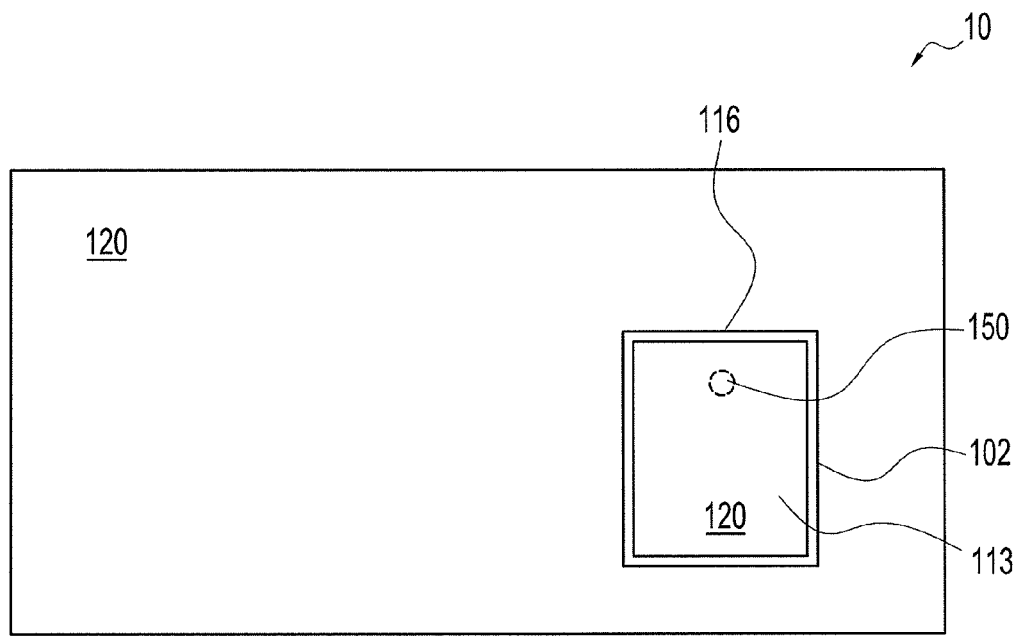
Figure 5L:
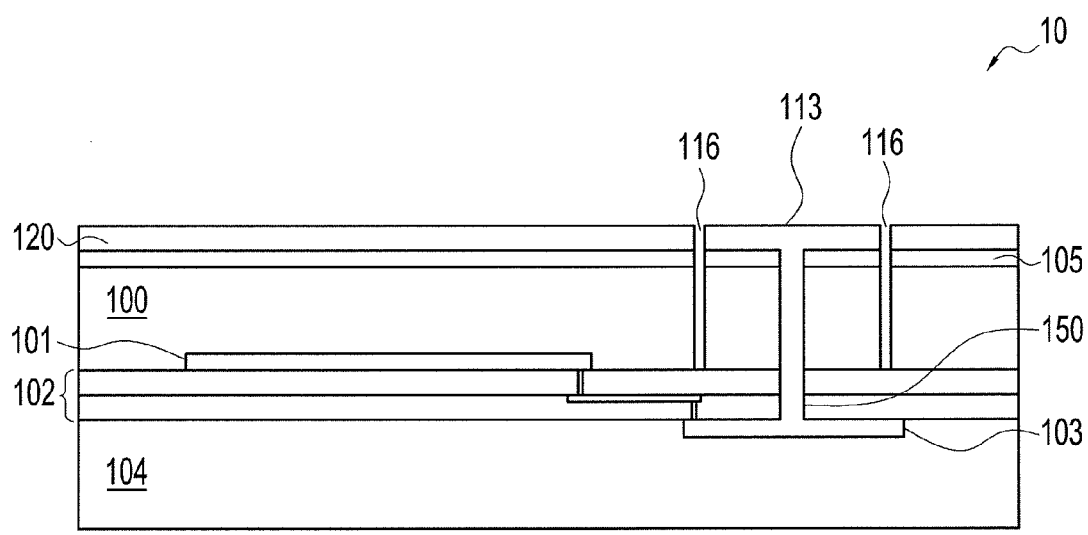

FIGS. 5I and 5J respectively illustrate top down and cross sectional views of the structure 10 after etching the areas exposed by the trenched etch mask 112 down to the dielectric material 102. The etch creates a trench 116 around the interconnect 150. FIG. 5I shows a trench 116 that forms a rectangular shape when viewed from the top down, but any shape that surrounds the via 111 may be used. This etch forms a new isolated bond pad 113 that is electrically connected to the bond pad 103 by the electrical interconnect 150 above the level of dielectric material 102. The shape of bond pad 113 is defined by the trench 116 that surrounds the electrical interconnect 150. After the etch is completed, the etch mask 112 is removed using any suitable method. FIGS. 5K and 5L illustrate the structure 10 after the etch mask 112 is removed.

The trench 116 is used to form a dielectric barrier around the electrical interconnect 150 and to form an isolated bond pad 113, and can be any width suitable to provide electrical isolation when filled with a dielectric. The trench 116 may be, for example, 4 µm wide, the feature having an overall length and width of 68 µm by 80 µm when viewed from the top down. In FIGS. 5K and 5L, the trench opening 126 is formed so that the electrical interconnect 150 is to one side of the area formed by the trench 116, as this provides a large surface area for subsequent connections. The trench 116, however, may be formed in any shape or position that surrounds the electrical interconnect 150. The size and shape of the trench 116 is defined by the trench opening 126 in etch mask 112.

Once the structure 10 is in the configuration illustrated in FIG. 5L, the structure may be completed according to a fourth or fifth embodiment as is described below. The fourth embodiment is now described by way of example with reference to FIGS. 6A-6G.

Figure 6A:
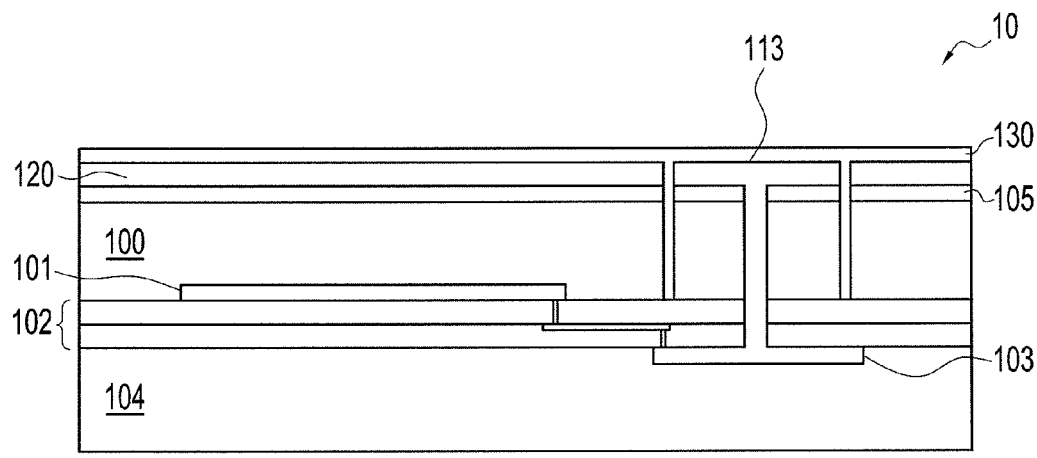
FIGS. 6A-6G illustrate in cross-section and top views the formation of an electrically isolated region around bond pads connected via an electrical interconnect in accordance with another embodiment described herein.

As shown in FIG. 6A, a dielectric material 130 is formed over the structure 10, filling trench 116. The dielectric material 130 may be, for example, a spin on dielectric (SOD), a screen print dielectric, a CVD deposited dielectric, or any other suitable dielectric material deposited using any suitable method. The dielectric material 130 may be, for example, an oxide material.

Forming a dielectric material 130 in the trench 116 electrically isolates the bond pad 113. The dielectric-filled trench is formed completely around the upper bond pad 113, and surrounds the interconnect 150 formed by the conductive material 120 down to the dielectric material 102. By electrically isolating the bond pad 113 and interconnect 150 in this manner, it is not necessary to take steps that will isolate the interconnect 150 when the via 111 is initially formed. In other words, it is not necessary to treat the sidewall surfaces of via 111 through methods such as sidewall passivation. This means, among other things, that the via 111 and subsequent interconnect 150 formed of conductive material 120 may be formed more narrow than in methods requiring isolation via sidewall passivation or other means. This also reduces processing steps.

Figure 6B:
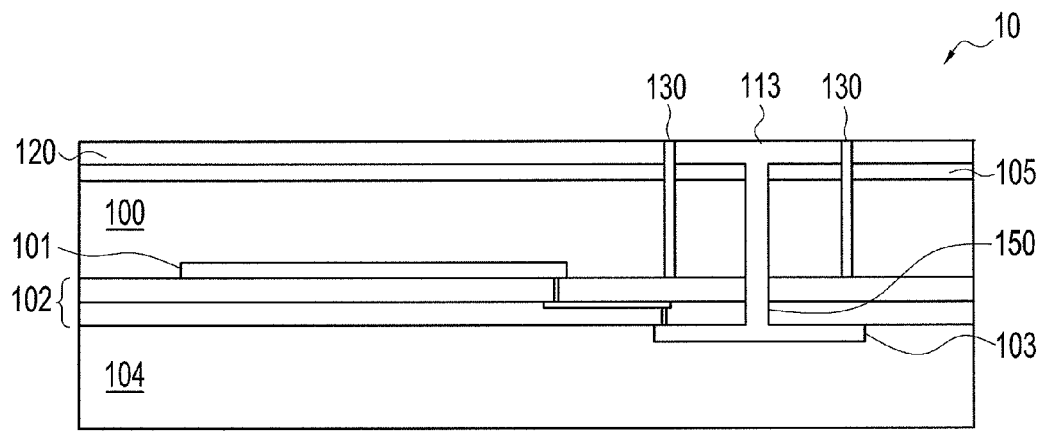
Figure 6C:
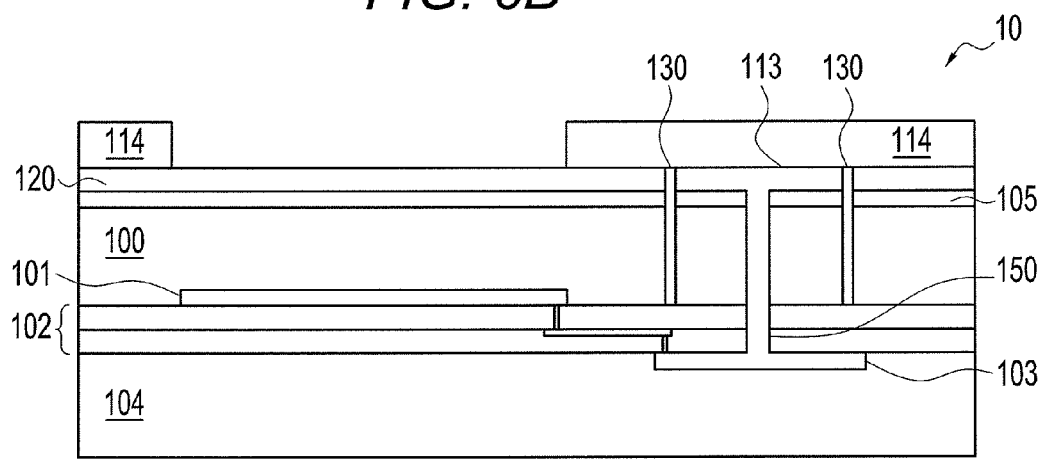
Figure 6D:
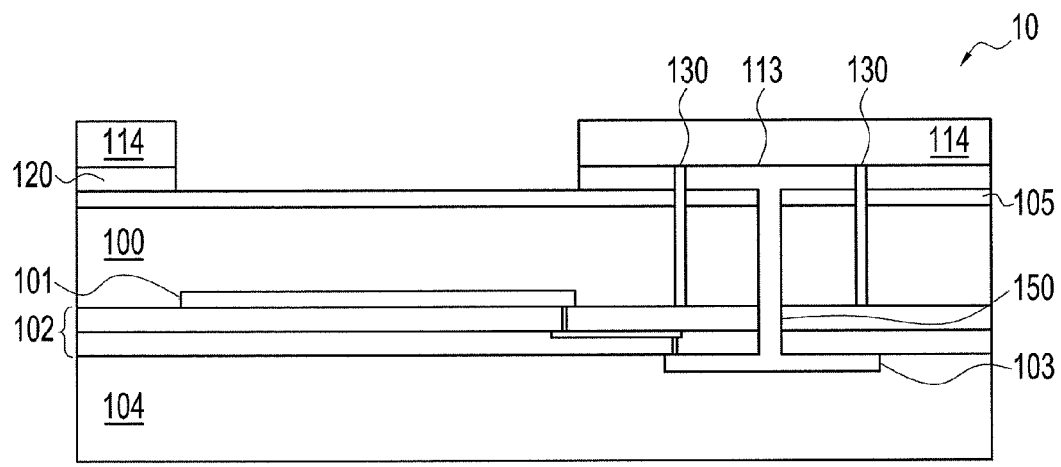

As shown in FIG. 6B, the dielectric material above the surface of the conductive material 120 is removed via planarizing or any other suitable method. FIG. 6C illustrates the structure 10 of FIG. 6B with an etch mask 114 formed thereon. The etch mask 114 is formed with an opening above the arrayed photosensors in imager circuitry 101. As illustrated in FIG. 6D, the etch mask 114 is used to remove the conductive material 120 above the imager circuitry 101 via etch. Optionally, the etch mask 114 could be used to remove the ARC material 105 as well, and a fresh ARC layer could be deposited in the area exposed by the etch mask 114. This would remedy any damage to the ARC material 105 caused during the etch. After the etch is performed, the etch mask 114 is removed.

Figure 6E:
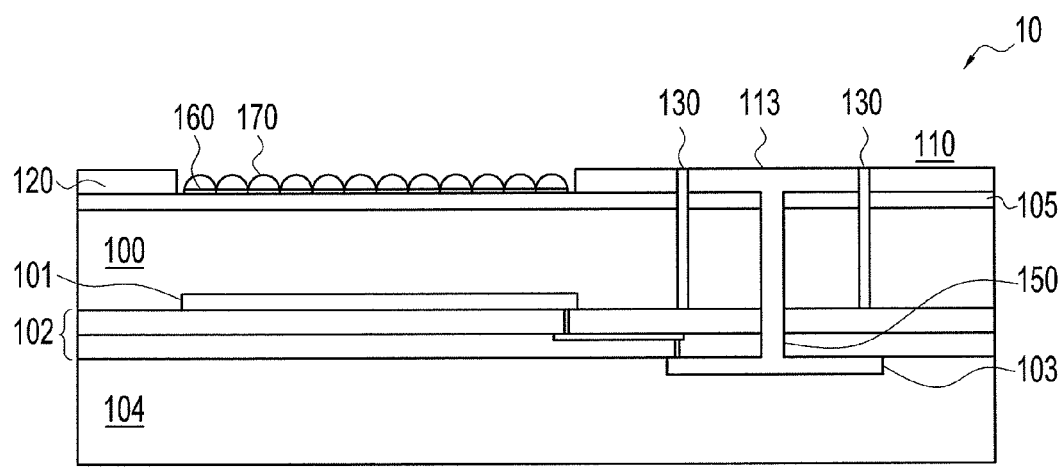

Next, in FIG. 6E, a color filter array (CFA) 160 is formed over the arrayed photosensors. The CFA 160 can include red, green, and blue color filters formed in a Bayer pattern on the structure 10, and can be formed using known photolithographic techniques. The color filters of the CFA 160 pass certain wavelengths of light while blocking others as known in the imaging art. As illustrated in FIG. 6E, structure 10 also includes microlenses 170 formed above the CFA 160 to focus light onto the pixels of the imager circuitry 101. The color filter array 160 and microlenses 170 may be formed using spin-coating, printing, laminating, or other known techniques. The substantially flat surface of the substrate 100 facilitates formation of the CFA 160 and microlenses 170. The small via openings as well as the trench reduce the streaking of color filter resists and prevent thickness uniformity issues.

Figure 6F:
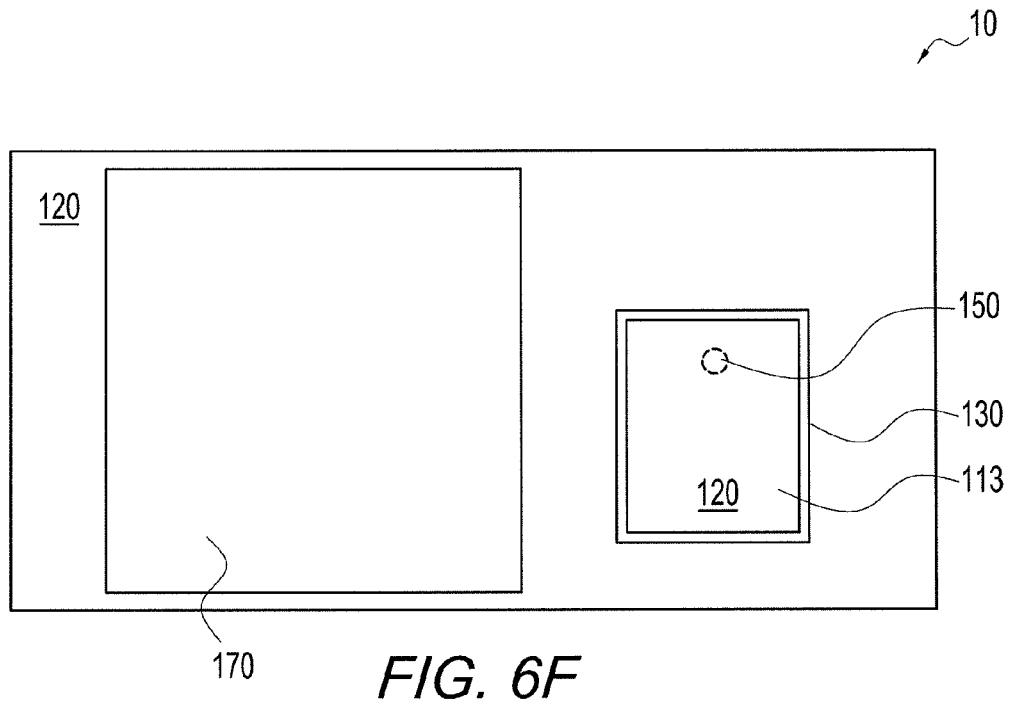
Figure 6G:
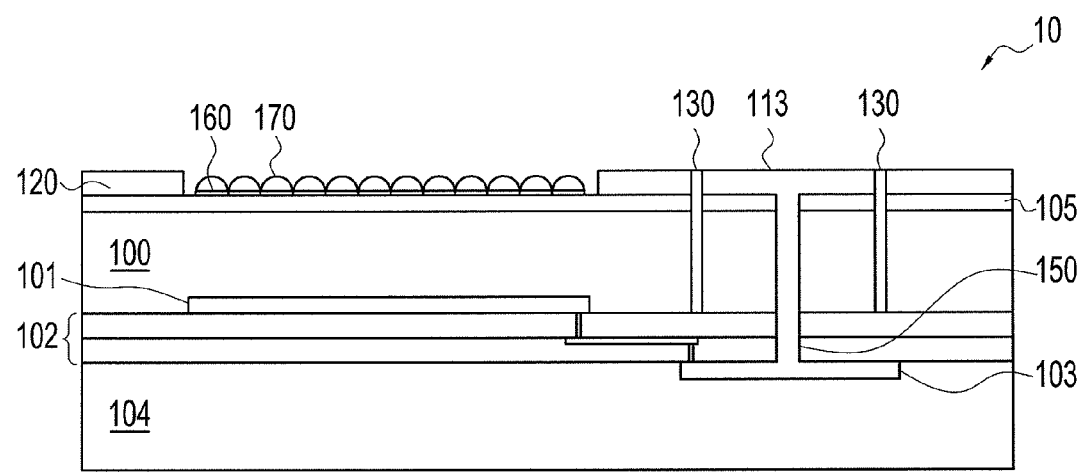

FIGS. 6F and 6G respectively illustrate top down and cross sectional views of a completed structure 10 for use in a backside illuminated imager device formed in accordance with the first embodiment. The structure 10 is formed with a CFA 160 and microlenses 170 over the photosensors within imager circuitry 101. The bond pad 103 below the dielectric material 102 is connected to newly formed bond pad 113 on the surface of the structure 10 via the interconnect 150. The bond pad 113 connected to the imager circuitry 101 and the interconnect 150 are electrically isolated by the dielectric material 130 formed in the trench 116. The formed structure 10 has minimal surface features, while still providing an electrical connection to buried bond pad 103. The bond pad 103 may be electrically connected to the imager circuitry 101, as illustrated in FIG. 6G, or may be connected to other features of the structure 10 requiring an external electrical connection. Remaining conductive material 120 on the surface of the structure 10 acts as a light block, preventing light from the sides of the device from reaching the arrayed photosensors within imager circuitry 101.

Figure 7A:
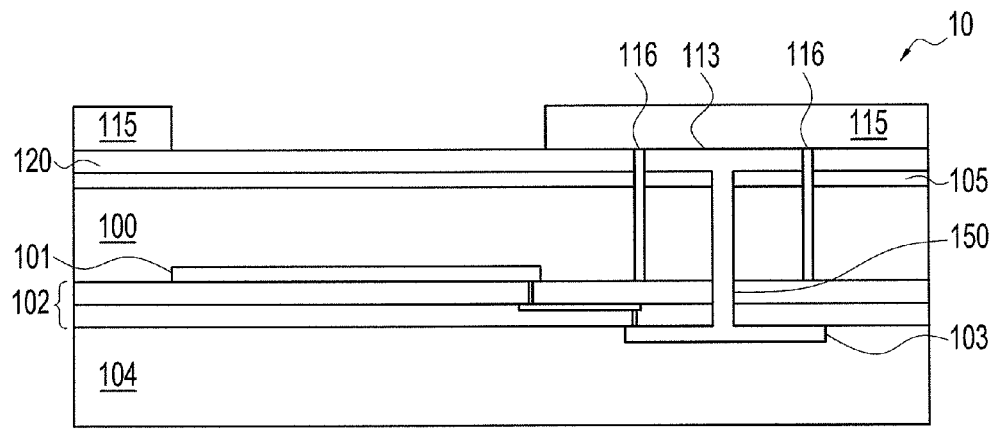
FIGS. 7A-7H illustrate in cross-section and top views the formation of an electrically isolated region around bond pads connected via an electrical interconnect in accordance with another embodiment described herein.
Figure 7B:
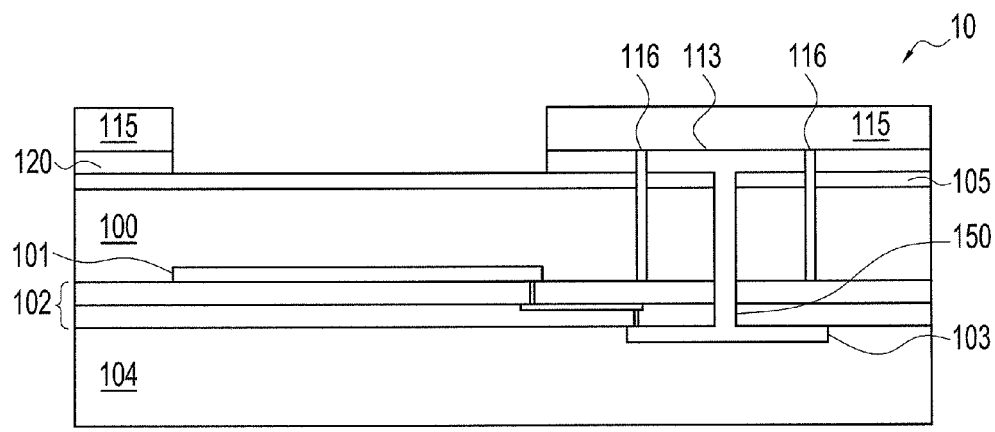
Figure 7C:
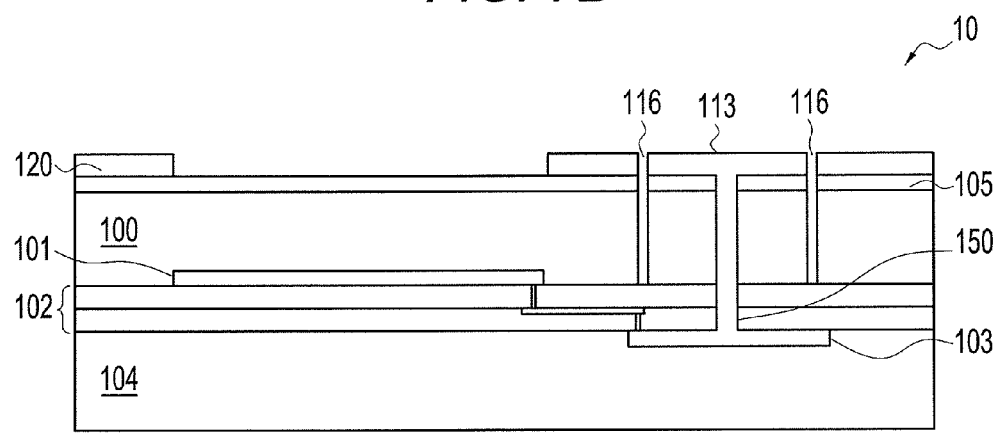

A fifth embodiment for completing the structure 10 structure is now described in reference to FIGS. 7A-7H. In the fifth embodiment, the dielectric material 130 is deposited at a later stage, and there are even less surface features in the completed structure 10. FIG. 7A illustrates the structure 10 of FIG. 5I with an etch mask 115 formed over the conductive material 120. The etch mask 115 has a portion removed above the arrayed photosensors within the imager circuitry 101. A suitable etch mask material is used so that the remaining mask material does not form in the trench 116. For example, a high viscosity etch mask material may be used so that the etch mask material forms over, but not in, the trench 116. As illustrated in FIG. 7B, the etch mask 115 is used with a wet or dry etching process to pattern the structure 10, removing the conductive material 120 above the imager circuitry 101. Optionally, the etch mask 115 could be used to remove the ARC material 105 as well, and a fresh ARC layer could be deposited in the area exposed by the etch mask 115. This would remedy any damage to the ARC material 105 caused during the etch. The etch mask 115 is then removed, as illustrated in FIG. 7C.

Figure 7D:
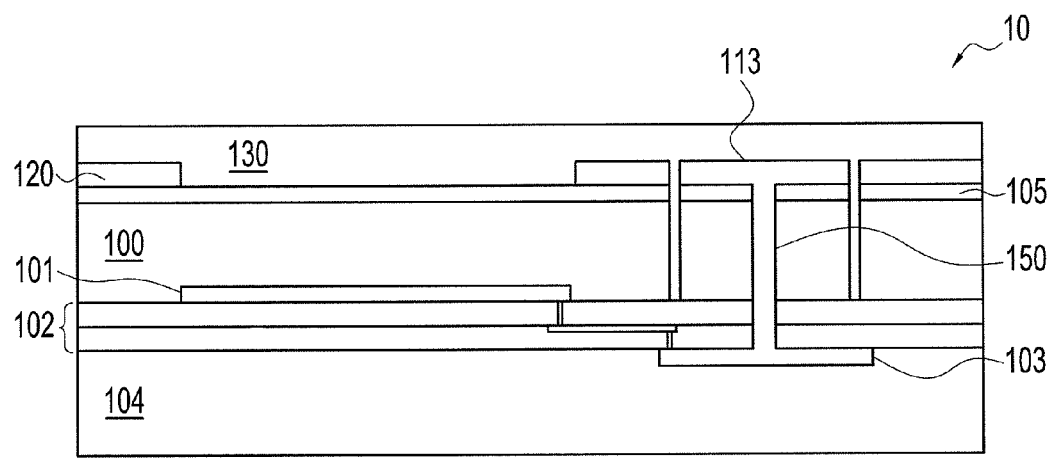
Figure 7E:
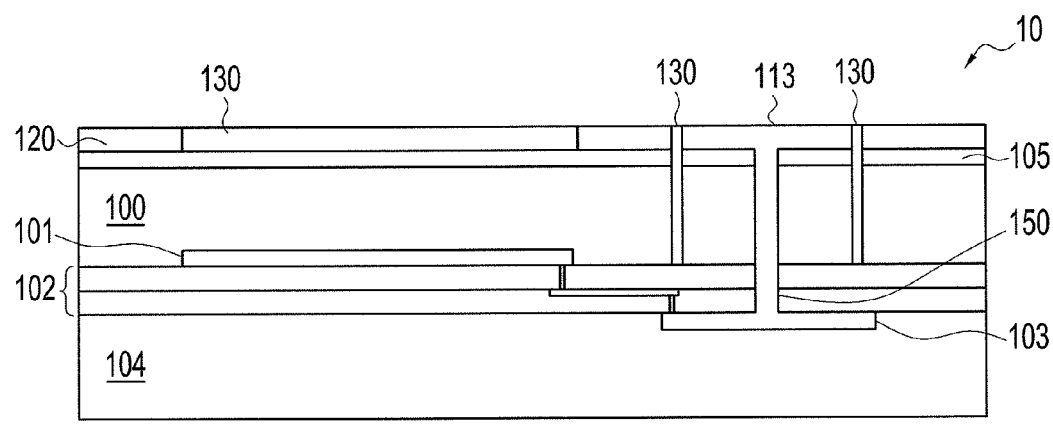
Figure 7F:
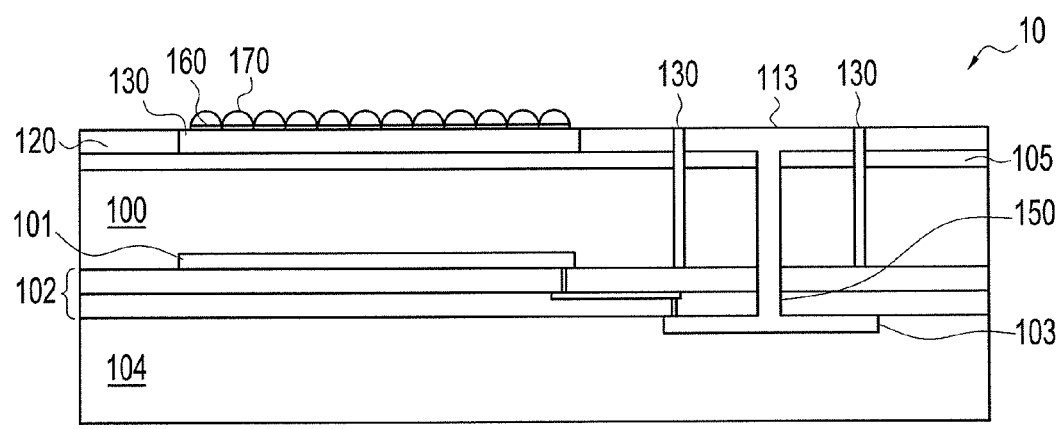

Next, illustrated in FIG. 7D, a dielectric material is deposited over the structure 10. The dielectric material 130 may be, for example, a spin on dielectric (SOD), a screen print dielectric, a CVD deposited dielectric, or any other suitable dielectric material deposited using any suitable method. The dielectric material 130 fills the trench 116, electrically isolating the interconnect 150, and also fills the area above the photosensors within imager circuitry 101. After the dielectric material 130 is deposited, excess dielectric material 130 above the conductive material 120 is removed, as illustrated in FIG. 7E. In FIG. 7F, a CFA 160 and microlenses 170 are formed over the dielectric material 130 above the photosensors within imager circuitry 101.

Figure 7G:
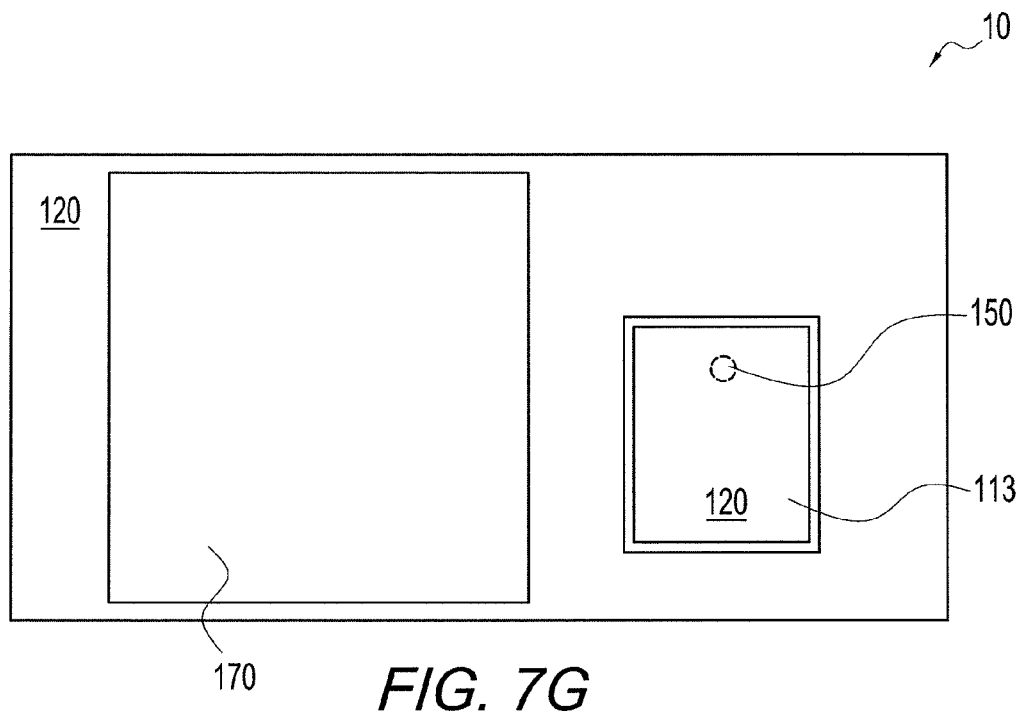
Figure 7H:
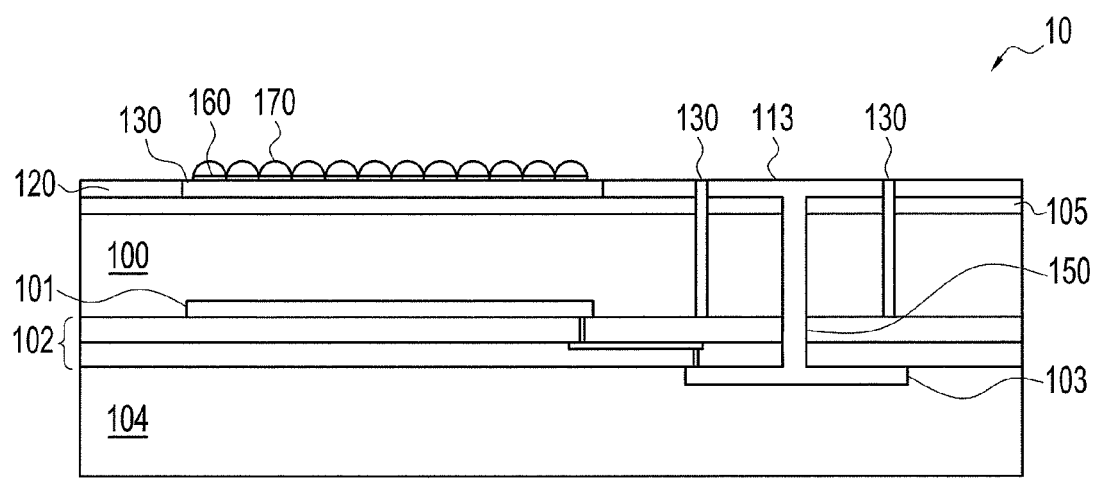

FIGS. 7G and 7H illustrate in top down and cross sectional views the completed backside illuminated imager device formed in accordance with the fifth embodiment. The structure 10 is formed with a CFA 160 and microlenses 170 over photosensors within imager circuitry 101. The bond pad 103 below the dielectric material 102 is connected to newly formed bond pad 113 on the surface of the structure 10 via the interconnect 150. The bond pad 113 and the interconnect 150 are electrically isolated by the dielectric material 130 formed in the trench 116. The formed structure 10 has minimal surface features, while still providing an electrical connection to bond pad 103. Remaining conductive material 120 on the surface of the structure acts as a light block, preventing light from the sides of the device from reaching the imager circuitry 101.

There are advantages and disadvantages of the fourth and fifth described embodiments. As shown in FIG. 7H, the completed structure 10 in accordance with the second embodiment has even less surface topography than the structure 10 of the first embodiment (illustrated in 6E). On the other hand, in the FIG. 7G device, light must pass through an additional layer of dielectric material 130 before reaching imager circuitry 101, thus decreasing efficiency. Accordingly, one method or the other may be suitable for different applications.

FIGS. 8A-8B and 9A-9B describe additional embodiments of a structure 10 for use in a backside illuminated imager device. As described above, the vias 111, 211, 311 used to form the electrical interconnects 150 may be formed according to many configurations. The electrical interconnects 150 may have different placements with respect to the bond pad 113, and may have different shapes.

Figure 8A:
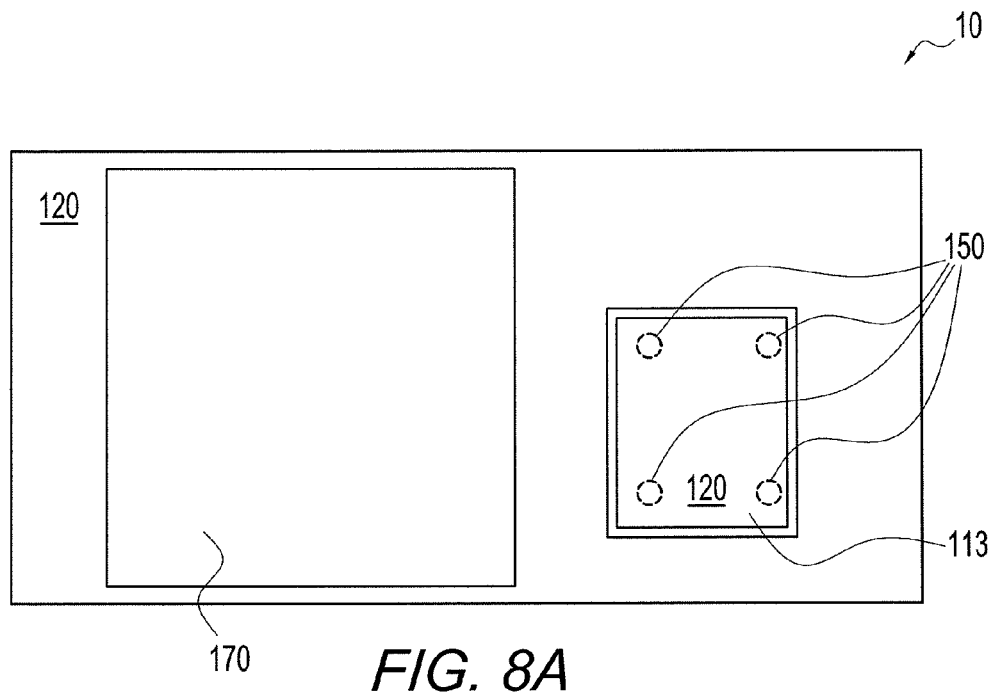
FIGS. 8A-8B illustrate in cross-section and top views multiple electrical interconnects between bond pads of a device formed in accordance with another embodiment described herein.
Figure 8B:
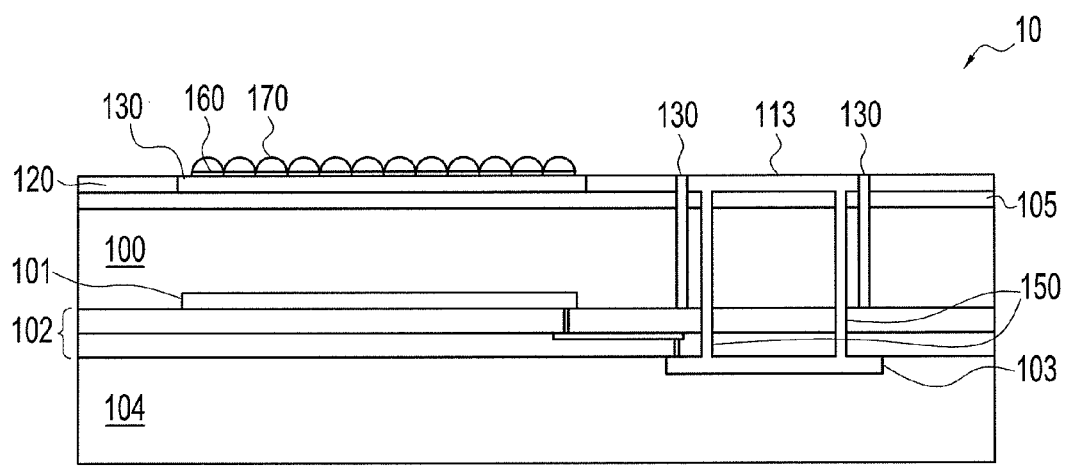
Figure 9A:
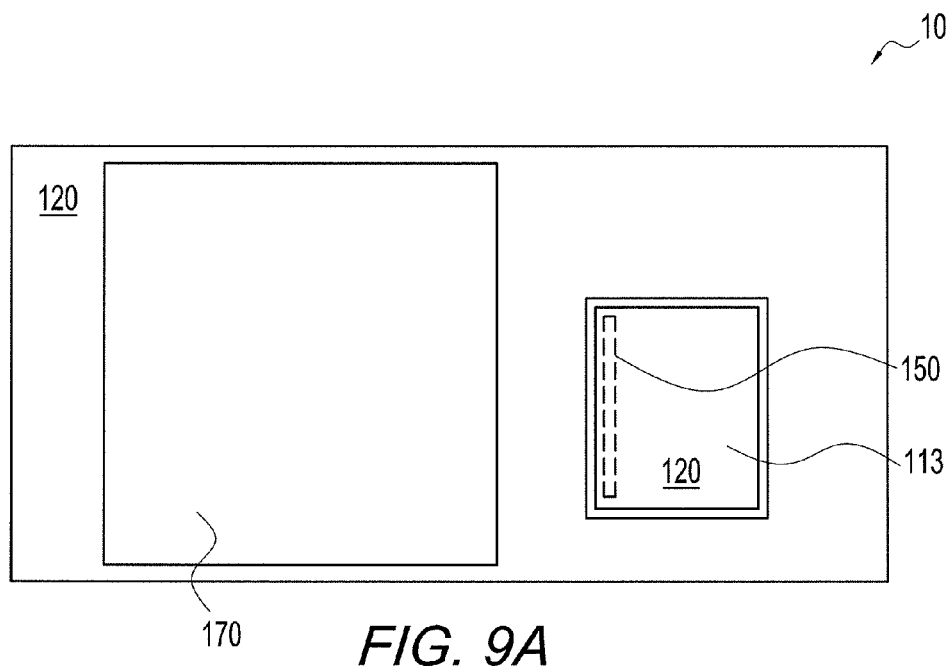
FIGS. 9A-9B illustrate in cross-section and top views an electrical interconnect between bond pads of a device formed in accordance with another embodiment described herein.
Figure 9B:
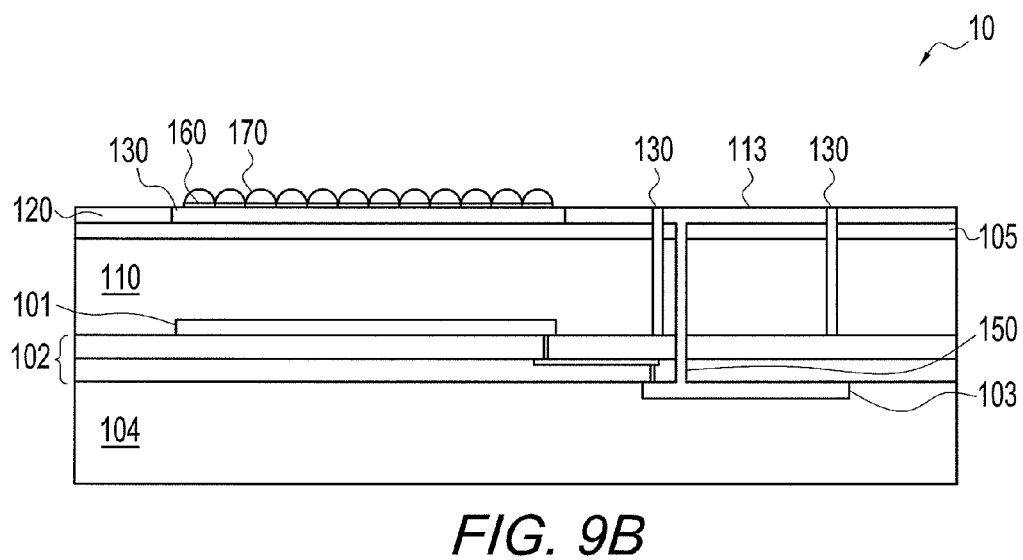

FIGS. 8A and 8B respectively illustrate a top down and a cross sectional views of a structure 10 formed with multiple electrical interconnects 150. In this embodiment, electrical interconnects 150 are formed at each corner of a rectangular bond pad 113. FIGS. 9A and 9B respectively illustrate a top down and a cross sectional view of a structure 10 formed with an electrical interconnect 150 that is formed in a rectangular trench of a rectangular bond pad 113. These embodiments provide enhanced structural and electrical properties while still providing a substantial bond pad 113 surface on which to form an electrical connection such as a wire bond. FIGS. 8A-8B and 9A-9B illustrate two examples of variations in the size and shape of the electrical interconnect 150. Other configurations can also be used. The embodiments of FIGS. 8A-8B and 9A-9B are shown as formed via the method of the FIGS. 7A-7H embodiment, but could also be formed according to the method of the FIGS. 6A-6G embodiment. Similarly, the FIGS. 1A-1N, 2A-2B, 3A-3D and 4A-4N, embodiments could be modified to form electrical interconnects 150 such as those in FIGS. 8A-8B and 9A-9B.

Figure 10A:
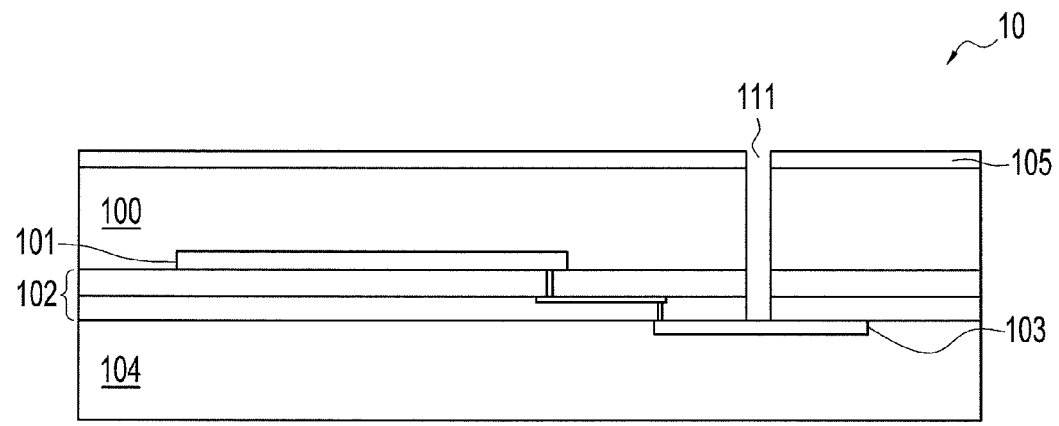
FIGS. 10A-10E illustrate the formation of an electrical interconnect in accordance with another embodiment described herein.

Additionally, in any of the above-described embodiments, an interconnect may be formed only partially filling vias 111, 241, 251. This is illustrated in FIGS. 10A-10E. FIG. 10A illustrates a structure 10 substantially similar to the structure 10 in FIG. 5E, before the conductive material 120 is to be deposited to form the electrical interconnect 150.

Figure 10B:
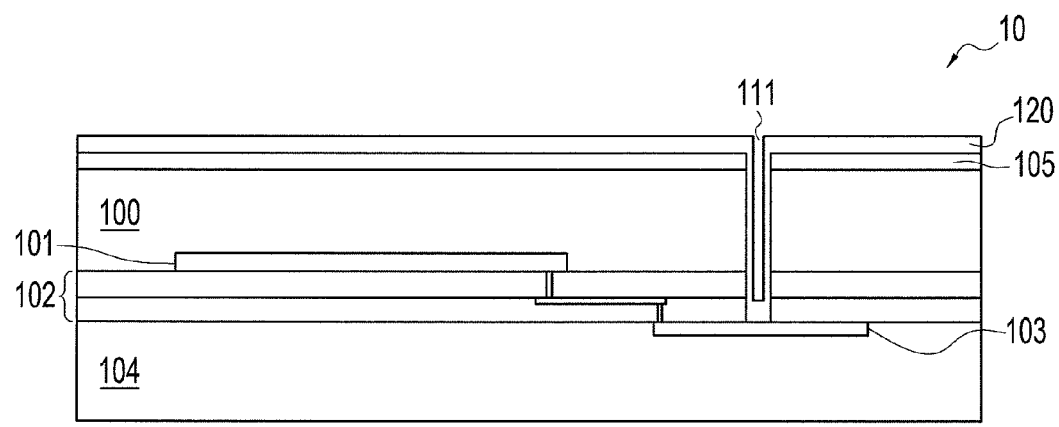

As shown in FIG. 10B, conductive material 120 can be formed on the exposed surfaces of the ARC material 105, the substrate 100, and the bond pad 103. The conductive material 120 can be formed using techniques such as CVD, PVD or ALD. When formed in this manner, the conductive material 120 may not completely fill the via 111 (as it does in the above embodiments), but it covers the sidewall of via 111 and is formed in contact with the bond pad.

Figure 10C:
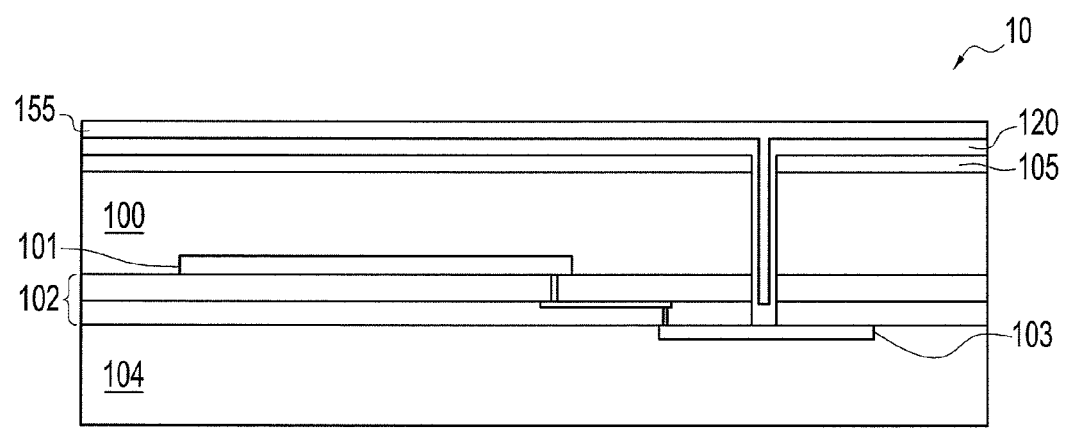
Figure 10D:
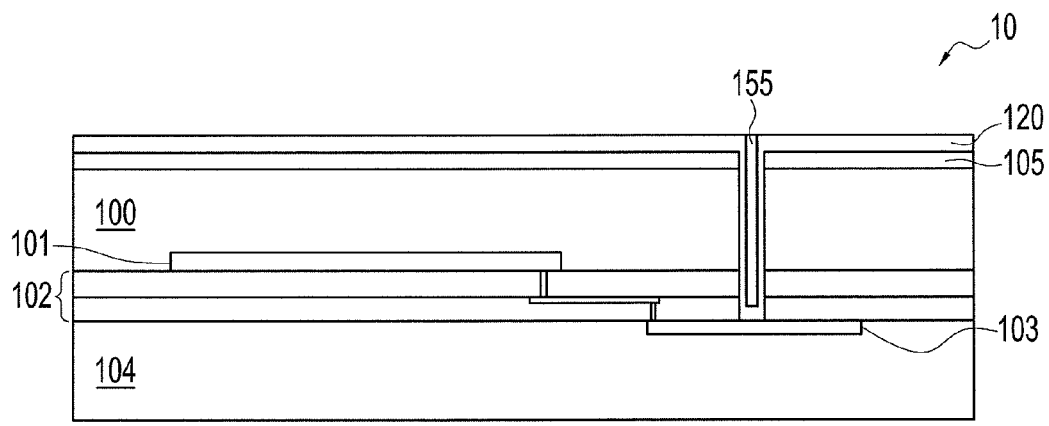
Figure 10E:
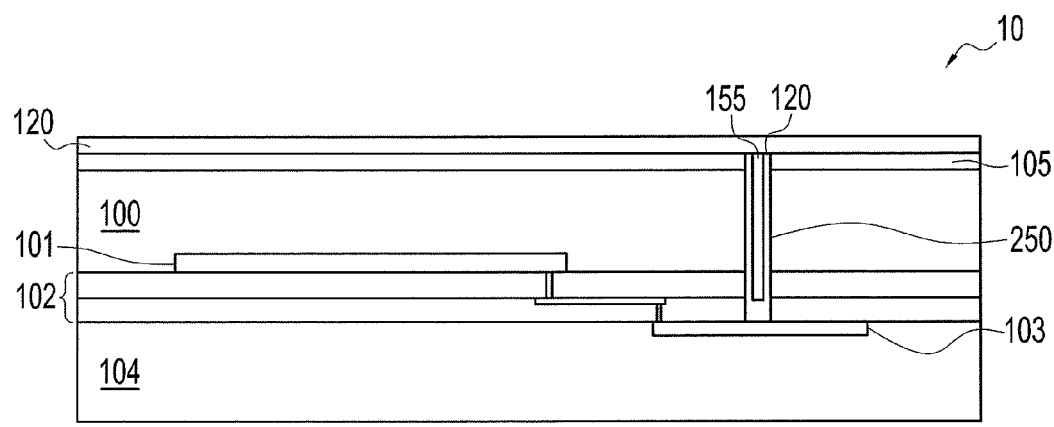

FIG. 10C illustrates the FIG. 10B structure 10 after a dielectric 155 is deposited over the structure 10. The dielectric 155 fills the space in the via 111 that is not filled with the conductive material 120. Next, as shown in FIG. 10D, the dielectric 155 above the substrate 100 is removed. At this point, the processing of the structure 10 can proceed as described in the above-described embodiments. For example, a conductive bond pad may be formed from the conductive material 120, as illustrated in FIGS. 1K and 1L. Alternatively, the conductive material 120 above the ARC material 105 in FIG. 10D can be removed, and a new layer of conductive material 120 may be deposited on the surface of the structure 10, as illustrated in FIG. 10E. This new layer of conductive material 120 can then be formed into a conductive bond pad according to the above-described embodiments, such as the embodiment illustrated in FIGS. 1K and 1L. The FIG. 10E embodiment has an advantage of using a layer of conductive material 120 that has been subject to fewer processing steps as the conductive bond pad. As mentioned above, the method of forming an interconnect 250 illustrated in FIGS. 10A-10E may be used in any of the above-described embodiments.

The above described methods and structures for backside illuminated imager devices have numerous advantages. The methods involve a reduction in process steps and cost over previous technologies, and the above-described embodiments include fewer surface features than methods that remove entire portions of substrate above the bond pad 103 to provide a surface for wire bonding.

Additionally, the new bond pad 113 is a superior surface for bonding, because it is involved in fewer processing steps than the original bond pad 103. The original bond pad 103 is contaminated by etch chemistries during the etching of the dielectric material 102. The new bond pad 113, on the other hand, is formed with a fresh layer of metal that is uncontaminated by etch chemistries. Among other things, this results in improved wire bond capabilities and higher wire bond reliability.

Furthermore, if bond pad 113 is created to be similar in shape and size to the buried bond pad 103, a recipient of the imager device may treat it in the same manner as a frontside illuminated imager device. That is, they do not need to change processes to account for the embedded features of the backside illuminated imager device. Other advantages include that the size of the buried bond pad 103 can be reduced, where desirable, and that conductive material 120 deposited over the ARC material 105 or dielectric material 205, 215 in the above-described methods can provide increased light block capability.

Figure 11:
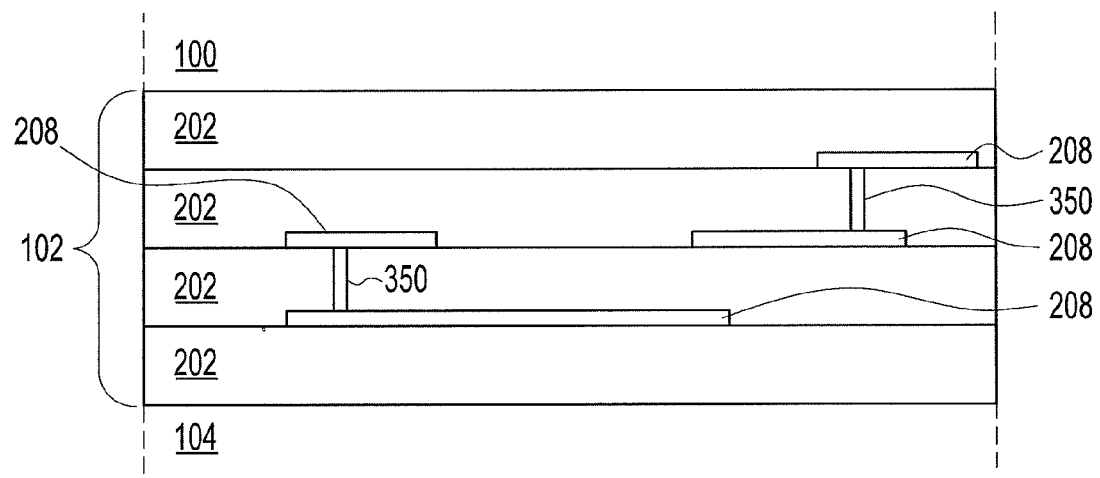
FIG. 11 illustrates connections formed in dielectric layers of a backside illuminated imager device in accordance with embodiments described herein.

FIG. 11 illustrates a detailed example of features that may be formed in dielectric material 102. The dielectric material 102 may be formed as multiple layers of interlayer dielectric material 202, such as borophosphosilicate glass (BPSG) or an oxide. Each of the multiple layers of interlayer dielectric material 202 support and insulate multiple layers of conductive material traces 208 that form electrical connections to various components of the device. The traces 208 are connected via conductive interconnects 350 formed in the interlayer dielectric material 202 layers. The number of layers of interlayer dielectric material 202 and conductive material traces 208 will vary depending on the complexity of the device.

Figure 12:
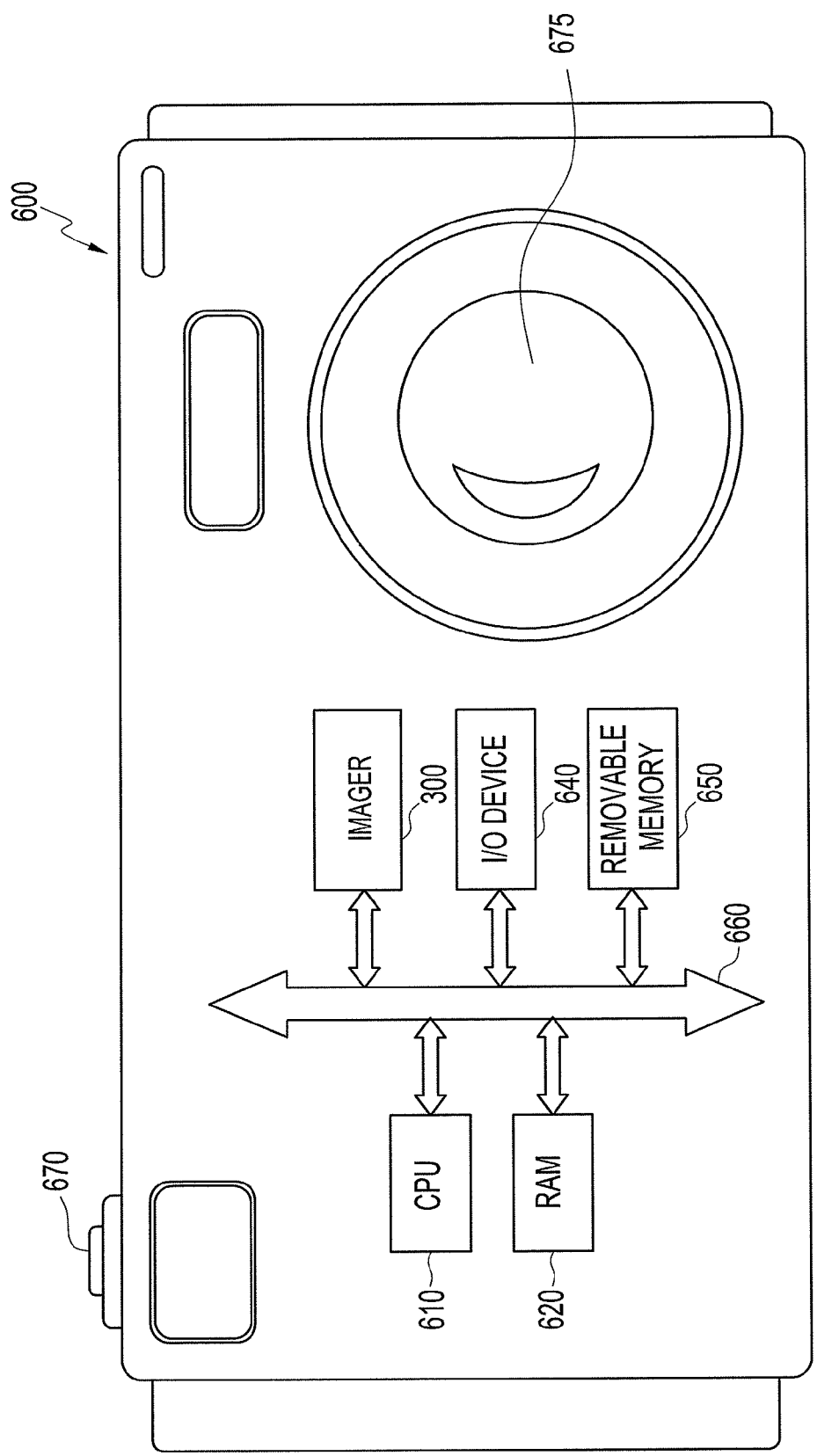
FIG. 12 illustrates a system which may be used with any of the embodiments described herein.

FIG. 12 shows a system 600, for example, a digital camera system, which includes the imager device formed from a structure 10 as in of FIGS. 2B, 3E, 4N, 6G, 7H, 8B and 9B. The system 600 is an example of a system having digital circuits that could include imager devices. Without being limiting, in addition to a digital camera system, such a system could include a computer system, scanner, machine vision system, vehicle navigation system, video telephone, surveillance system, automatic focus system, star tracker system, motion detection system, image stabilization system, and other processing systems employing an imager 300.

System 600 generally comprises a central processing unit (CPU) 610, such as a microprocessor, that communicates with an input/output (I/O) device 640 over a bus 660. Imager 300 also communicates with the CPU 610 over the bus 660. The system 600 also includes random access memory (RAM) 620, and can include removable memory 650, such as flash memory, which also communicate with the CPU 610 over the bus 660. Imager 300 may be combined with a processor, such as a CPU 610, digital signal processor, or microprocessor, in a single integrated circuit. In a camera application, a shutter release button 670 is used to operate a mechanical or electronic shutter to allow image light which passes through a lens 675 to be captured by the array diodes 302 of imager 300.

The above description and drawings are only to be considered illustrative of specific embodiments, which achieve the features and advantages described herein. Modifications and substitutions to specific process conditions can be made. The order of the steps in forming the structure 10 is not limited to the embodiments as described with respect to the figures, and can be completed in any order except where a subsequent step requires a preceding step. Accordingly, the embodiments are not considered as being limited by the foregoing description and drawings, but is only limited by the scope of the appended claims.

We claim:

1. An integrated circuit comprising: circuitry provided on a first side of a substrate;
   a first conductive pad connected to said circuitry and provided spaced from said first side of said substrate;
   a second conductive pad spaced from a second side of said substrate;
   an electrically conductive interconnect formed through said substrate to interconnect said first and second conductive pads; and
   a dielectric material that only laterally surrounds said second conductive pad and at least a portion of said interconnect that passes through said substrate.

2. The integrated circuit of claim 1, wherein said circuitry provided on said first side of said substrate comprises imager circuitry including an array of photosensors, said first conductive pad connects to said imager circuitry, and said second conductive pad provides a bond pad for connecting external wiring to said imager circuitry.

3. The integrated circuit of claim 2, further comprising a trench that surrounds said second conductive pad and is spaced from and surrounds at least a portion of said interconnect that passes through said substrate, said dielectric material being formed in said trench.

4. The integrated circuit of claim 3, further comprising an anti-reflective coating on at least a portion of said second side of said substrate.

5. The integrated circuit of claim 4, further comprising a conductive material on a first side of said anti-reflective coating.

6. The integrated circuit of claim 5, further comprising:
   a second trench formed in said anti-reflective coating and said conductive material, said second trench formed above said array of photosensors;
   another dielectric material provided in said second trench;
   a color filter array formed in contact with said dielectric material provided in said second trench; and
   a microlens array provided over said color filter array.

7. The integrated circuit of claim 2, wherein said electrically conductive interconnect is formed at a corner of the second conductive pad.

8. The integrated circuit of claim 2, further comprising at least a second electrically conductive interconnect formed between said first and second conductive pads.

9. The integrated circuit of claim 2, further comprising another dielectric material provided on said first side of said substrate, wherein said first conductive pad is provided on a first side of said another dielectric material.

10. A method for forming an imager comprising:
    forming a substrate;
    forming circuitry on a first side of the substrate;
    forming a conductive pad connected to the circuitry and spaced from the first side of the substrate;
    forming a via through the substrate to the conductive pad;
    forming a conductive material on a second side of the substrate and in the via, the conductive material being formed in contact with the conductive pad;
    forming a trench through the conductive material and at least a portion of the substrate, the trench surrounding the via; and
    filling the trench with a dielectric material.

11. The method of claim 10, wherein the circuitry comprises imager circuitry including an array of photosensors and the conductive pad connects to the imager circuitry.

12. The method of claim 10, further comprising:
forming at least a second via through the substrate to the conductive pad; and
forming the conductive material in the second via.

13. A method for forming an imager comprising:
forming a substrate;
forming circuitry on a first side of the substrate;
forming a conductive pad connected to the circuitry and spaced from the first side of the substrate;
forming a first via through the substrate;
forming a dielectric material in the first via;
forming a second via inside the dielectric material in the first via, the second via being formed down to the conductive pad;
forming a conductive material on a second side of the substrate and in the second via, the conductive material being formed in contact with the conductive pad; and
removing a portion of the conductive material on the second side of the substrate to form a second conductive pad, wherein the dielectric material in the first via only laterally surrounds the second conductive pad.

14. The method of claim 13, wherein the first via is formed through the substrate and to the conductive pad.

15. The method of claim 13, further comprising:
forming an additional dielectric material on the first side of the substrate, the first via being formed through the substrate and to said additional dielectric material, but not through said additional dielectric material to the conductive pad.

* * * * *